(12) United States Patent
Johnson et al.

(10) Patent No.: US 10,049,001 B1
(45) Date of Patent: Aug. 14, 2018

(54) DYNAMIC ERROR CORRECTION CONFIGURATION

(71) Applicant: Amazon Technologies, Inc., Seattle, WA (US)

(72) Inventors: Robert Michael Johnson, Austin, TX (US); Thomas A. Volpe, Austin, TX (US)

(73) Assignee: Amazon Technologies, Inc., Seattle, WA (US)

( * ) Notice: Subject to any disclaimer, the term of this patent is extended or adjusted under 35 U.S.C. 154(b) by 137 days.

(21) Appl. No.: 14/671,800

(22) Filed: Mar. 27, 2015

(51) Int. Cl.
| | |
|---|---|
| *G06F 11/10* | (2006.01) |
| *G06F 9/455* | (2018.01) |
| *G06F 11/08* | (2006.01) |
| *H03M 13/03* | (2006.01) |
| *G06F 9/46* | (2006.01) |
| *H03M 13/05* | (2006.01) |

(52) U.S. Cl.
CPC .............. *G06F 11/10* (2013.01); *G06F 9/455* (2013.01); *G06F 9/45533* (2013.01); *G06F 9/45558* (2013.01); *G06F 9/467* (2013.01); *G06F 11/08* (2013.01); *G06F 11/1004* (2013.01); *G06F 2009/45579* (2013.01); *G06F 2009/45583* (2013.01); *H03M 13/03* (2013.01); *H03M 13/05* (2013.01)

(58) Field of Classification Search
CPC .. G06F 9/455; G06F 9/45533; G06F 9/45558; G06F 9/467; G06F 2009/45579; G06F 2009/45583; G06F 11/08; G06F 11/10; G06F 11/1004; H03M 13/03; H03M 13/05

See application file for complete search history.

(56) References Cited

U.S. PATENT DOCUMENTS

| | | | |
|---|---|---|---|
| 5,577,213 A | 11/1996 | Avery et al. | |
| 6,298,370 B1 | 10/2001 | Tang et al. | |
| 6,925,641 B1 | 8/2005 | Elabd et al. | |
| 7,657,891 B2 | 2/2010 | Jensen et al. | |
| 7,835,380 B1 | 11/2010 | Aloni et al. | |
| 7,992,144 B1 | 8/2011 | Hendel et al. | |
| 8,427,347 B1 | 4/2013 | Chai et al. | |
| 8,850,288 B1 * | 9/2014 | Lazier ................. | G06F 11/1048 714/763 |

(Continued)

OTHER PUBLICATIONS

U.S. Appl. No. 14/620,764, filed Feb. 12, 2015, Titled: Servicing I/O Requests in an I/O Adapter Device.
U.S. Appl. No. 14/672,658, filed Mar. 30, 2015, Titled: Low Latency Write Requests.
U.S. Appl. No. 14/673,474, filed Mar. 30, 2015, Titled: Streaming Interconnect Architecture.

(Continued)

*Primary Examiner* — Albert Decady
*Assistant Examiner* — Christian Dorman
(74) *Attorney, Agent, or Firm* — Kilpatrick Townsend & Stockton LLP

(57) ABSTRACT

Server computers often include one or more input/output (I/O) devices for communicating with a network or direct attached storage device. Data written to or read from storage devices may acquire errors in transit. The I/O adapter device may implement processes to generate or check error correction values, where the error correction values are provided to verify the correctness of the written or read value. The I/O adapter device may determine the portion of the data to be used in calculating the error correction value in a flexible and configurable manner.

22 Claims, 24 Drawing Sheets

(56) References Cited

U.S. PATENT DOCUMENTS

| | | | |
|---|---|---|---|
| 2003/0090702 A1 | 5/2003 | Trelewicz et al. | |
| 2008/0320476 A1 | 12/2008 | Wingard et al. | |
| 2009/0055826 A1 | 2/2009 | Bernstein et al. | |
| 2009/0150748 A1* | 6/2009 | Egner | G06F 11/1012 714/758 |
| 2009/0245097 A1 | 10/2009 | Takakuwa et al. | |
| 2012/0297039 A1* | 11/2012 | Acuna | G06F 8/61 709/223 |
| 2013/0198571 A1* | 8/2013 | Brewerton | G06F 11/1645 714/37 |
| 2013/0262958 A1* | 10/2013 | Ruggiero | G06F 11/10 714/763 |
| 2014/0115423 A1* | 4/2014 | Cooke | H03M 13/15 714/763 |
| 2015/0039577 A1* | 2/2015 | Talagala | G06F 9/467 707/703 |
| 2015/0178161 A1* | 6/2015 | Burd | G11B 20/1833 714/764 |
| 2015/0212844 A1* | 7/2015 | Tsirkin | G06F 9/45558 718/1 |
| 2015/0349805 A1* | 12/2015 | Tsai | H03M 13/2906 714/755 |

OTHER PUBLICATIONS

U.S. Appl. No. 14/750,926, filed Jun. 25, 2015, Titled: Data Size Reduction.

Kornaros et al., "Pipelined multi-queue management in a vlsi atm switch chip with credit-based flow-control", *Proceedings of the Seventeenth Conference on Advanced Research in VLSI*, 1997, pp. 127-144.

Ridenour et al., "Low-power buffer management for streaming data", *Circuits and Systems for Video Technology*, IEEE Transactions, 2007, pp. 143-157.

Tzeng et al., "Task management for irregular-parallel workloads on the GPU", *Proceedings of the Conference on High Performance Graphics*, Eurographics Association, 2010, pp. 29-37.

Bolla et al., "DROPv2: energy efficiency through network function virtualization", *IEEE Network*, vol. 28, No. 2 (2014), pp. 26-32.

Han et al., "Network function virtualization: Challenges and opportunities for innovations", *IEEE Communications Magazine*, vol. 53, No. 2 (2015), pp. 90-97.

Xavier et al., "Performance Evaluation of Container-Based Virtualization for High Performance Computing Environments View Document", *Parallel, Distributed and Network-Based Processing (PDP): 21st Euromicro International Conference on IEEE* (2013), pp. 233-240.

\* cited by examiner

DYNAMIC ERROR CORRECTION CONFIGURATION

BACKGROUND

Server computers often include one or more input/output (I/O) devices. For example, a server computer may include one or more I/O adapter devices for communicating with a network and/or direct-attached storage device. Each I/O device may communicate over multiple, possibly asynchronous interfaces, such as PCI Express (PCIe) and/or Ethernet. For example, a host server computer may send I/O transactions over a PCIe bus to the I/O adapter device, and the I/O adapter device may send those I/O transactions over an Ethernet cable for processing by another server.

Transmission of data over cables or other mediums sometimes results in errors in the transmitted data. These errors may occur for a variety of reasons, from misconfigured devices in the transmission path to radiation affecting the transmission medium or devices. Absent some mechanism for tracking the data in flight, neither the sender nor the recipient is aware that errors have been introduced into the transmitted data. When, however, the recipient is made aware of errors in the data, the recipient can take corrective measures, including correcting the errors or requesting that the data be sent again.

Various mechanisms exist for informing the recipient that there are errors in the received data. One such mechanism is to provide an error correction value with the transmitted data. An error correction value is a value produced by executing a calculation over all or part of the transmitted data. An error correction value may be calculated for transmitted data, and sent with the transmitted data. The recipient may then also calculate the error correction value, and compare its calculated value against the value it received with the data. When the values do not match, there may be an error in the transmitted data. Various methods exist for calculating error correction values, such as parity, checksum, cyclic redundancy check (CRC) and others.

BRIEF DESCRIPTION OF THE DRAWINGS

Various embodiments in accordance with the present disclosure will be described with reference to the drawings, in which.

DETAILED DESCRIPTION

Figure 1:
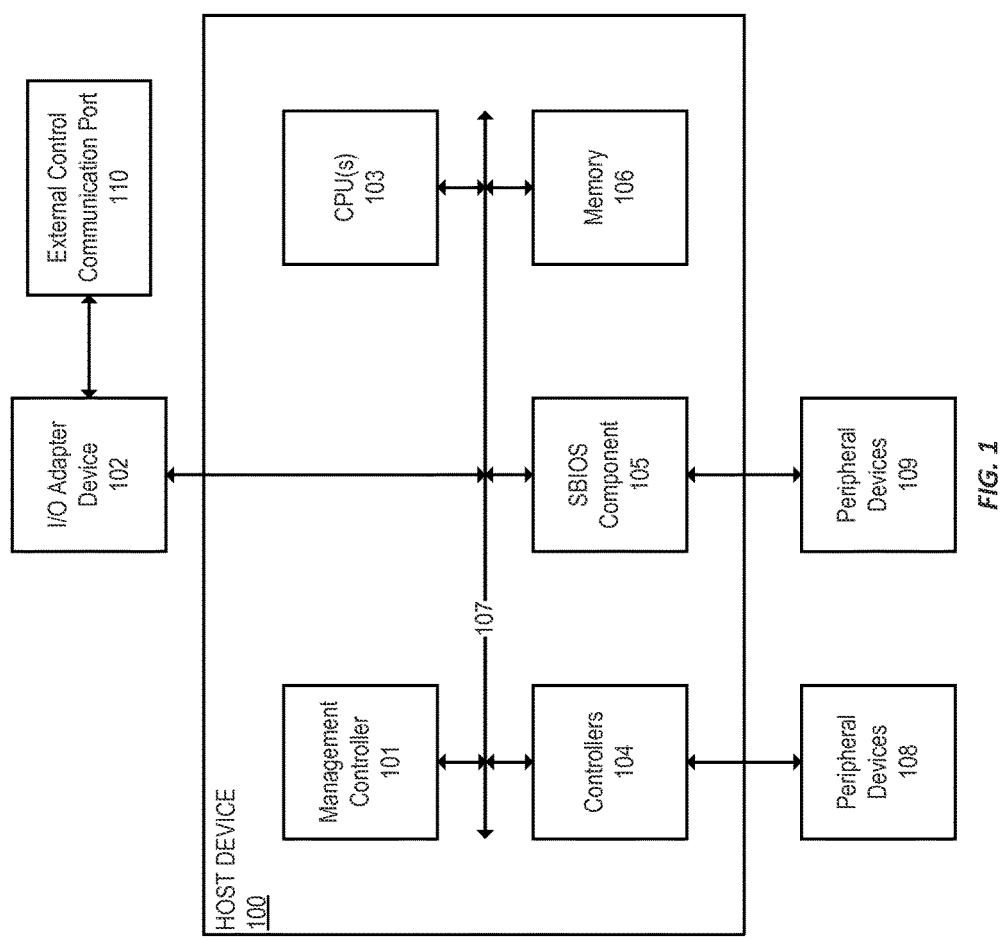
FIG. 1 shows a host device in communication with an I/O adapter device according to one embodiment.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Server computers often have a need to perform tasks outside the environment of the CPU and main memory (i.e., RAM). For example, the server may need to communicate with external entities (e.g., other servers) or process data using an external processor (e.g., a General Purpose Graphical Processing Unit (GPGPU)). In such cases, the CPU may interface with one or more I/O devices. In some cases, these I/O devices may be special-purpose hardware designed to perform a specific role. For example, an Ethernet network interface controller (NIC) may be implemented as an application-specific integrated circuit (ASIC) comprising digital logic operable to send and receive packets.

Techniques are described herein for providing error correction values with write data, and checking error correction values with read data. Error correction values may be provided and checked by an I/O adapter device. The I/O adapter device may be attached to or incorporated into a host computing device. The I/O adapter device receives read and write requests from the host device to read data from, or write data to a storage location. The transmission of data between the I/O adapter device and the storage location may result in errors being introduced into the transmitted data. Absent some mechanism for tracking the data in flight, neither the I/O adapter device nor the storage location is aware that errors have been introduced into the data. When the recipient—the storage location, in case of write requests and the I/O adapter in case of read requests—of the transmitted data is aware that there is an error in the data, the recipient can take corrective steps, such as possibly correcting the errors and/or requesting that the data be sent again.

One mechanism for informing the recipient of transmitted data that an error was introduced into the transmitted data is to provide an error correction value with the transmitted data. An error correction value is a value generated by executing a calculation of some amount of data. In some cases, multiple error correction values may be computed for one set of data by dividing the data into blocks. The error correction value is provided with the transmitted data to the recipient. Upon receiving the data, the recipient may also calculate an error correction value using the same data. The recipient may then check its calculated error correction value against the error correction value it received with the transmitted data. When the values are the same, then it is probable that the data was received without errors. When the values are different, it is probable that the transmitted data was received with errors.

From the perspective of an I/O adapter device, the I/O adapter device is the sender for write requests and the recipient for read requests. For write requests the I/O adapter device may generate error correction values, while for read requests the I/O adapter may check error correction values. In some situations, the error correction value sent with a write request from the I/O adapter is stored by the storage location with the write data. The storage location itself may not verify this error correction value in this situation. When data thusly stored with an error correction value is then read by the I/O adapter, the storage location may not calculate a new error correction value to send with the requested data. Instead, the storage location may return the stored value, along with the read data.

The processes for write and read requests are discussed in further detail below. The environment of the I/O adapter device is first discussed.

I. Systems

FIG. 1 shows a host device 100 in communication with an I/O adapter device 102 according to one embodiment. However, one skilled in the relevant art will appreciate that the disclosed illustrative components are not meant to be an exhaustive identification of all the components required by or present in a host device 100. Rather, illustrative components have been identified, in a non-limiting manner, to facilitate illustration of one or more aspects of the present application. Still further, the illustrative components of the host device 100 can be considered logical in nature such that the physical implementation of one or more components can be varied or such that one or more of the logical components may be implemented in a virtualized manner. Additionally, one or more host devices 100 can share one or more of the illustrated components, such as processors, graphical processing units, memory and the like.

In an illustrative embodiment, the host device 100 is associated with various hardware components, software components and respective configurations that facilitate the execution of low latency write requests, which will be described in detail below. Specifically, in one embodiment, host device 100 can include a management controller 101 for managing the operation of host device 100 in accordance with the Intelligent Platform Management Interface ("IPMI"). Specifically, the management controller 101 can include an embedded microcontroller that manages the interface between system management software and host device 100 components.

In communication with the host device 100 is an I/O adapter device 102. Generally, the I/O adapter device 102 may include any device that inputs and/or outputs data along a communication channel 107. In one aspect, the I/O adapter device 102 can communicate as a standard bridge component for facilitating access between various physical and emulated components and a communication channel 107. In another aspect, the I/O adapter device 102 can include embedded microprocessors to allow the I/O adapter device to execute computer executable instructions related to the implementation of management functions or the management of one or more such management functions, or to execute other computer executable instructions related to the implementation of the I/O adapter device 102. In some embodiments, the I/O adapter device 102 may be implemented using multiple discrete hardware elements, such as multiple cards or other devices. The management controller 101 can be configured in such a way to be electrically isolated from any other component in the host device 100 other than the I/O adapter device 102. In some embodiments, the I/O adapter device 102 is attached externally to the host device 100. In some embodiments, the I/O adapter device 102 is internally integrated into the host device 100.

Also in communication with the I/O adapter device 102 may be an external communication port component 110 for establishing communication channels between the host device 100 and one or more network based services or other network-attached or direct-attached computing devices. Illustratively, the external communication port component 110 can correspond to a network switch, sometimes known as a Top of Rack ("TOR") switch. The I/O adapter device 102 can utilize the external communication port component 110 to maintain communication channels between one or more services and the host device 100, such as health check services, financial services, and the like.

The I/O adapter device 102 can also be in communication with a System Basic Input/Output System (SBIOS) component 105. The SBIOS component 105 can include non-transitory executable code, often referred to as firmware, which can be executed by one or more processors and used to cause components of the host device 100 to initialize and identify system devices such as the video display card, keyboard and mouse, hard disk drive, optical disc drive and other hardware. The SBIOS component 105 can also include or locate boot loader software that will be utilized to boot the host device 100. For example, in one embodiment, the SBIOS component 105 can include executable code that, when executed by a processor, causes the host device 100 to attempt to locate Preboot Execution Environment (PXE) boot software. Additionally, the SBIOS component 105 can include or takes the benefit of a hardware latch that is electrically controlled by the I/O adapter device 102. The hardware latch can restrict access to one or more aspects of the SBIOS component 105, such controlling modifications or configurations of the executable code maintained in the SBIOS component 105.

The SBIOS component 105 can be connected to (or in communication with) a number of additional computing device resources components, such as central processing units ("CPUs") 103, memory 106 (e.g., RAM), and the like. In one embodiment, such computing device resource components may be physical computing device resources in communication with other components via the communication channel 107. The communication channel 107 can correspond to one or more communication buses, such as a shared bus (e.g, a front side bus, a memory bus), a point-to-point bus such as a PCI or PCI Express bus, etc., in which the components of the bare metal host device 100 communicate. Other types of communication channels, communication media, communication buses or communication protocols (e.g., the Ethernet communication protocol) may also be utilized. Additionally, in other embodiments, one or more of the computing device resource components may be virtualized hardware components emulated by the host device 100. In such embodiments, the I/O adapter device 102 can implement a management process in which a host device is configured with physical or emulated hardware components based on a variety of criteria. The computing device resource components may be in communication with the I/O adapter device 102 via the communication channel 107. In addition, although communication channel 107 in FIG. 1 is shown as connecting all of components 101-106, it should be appreciated that a communication channel in accordance with some embodiments may connect any subset of the components 101-106 and/or other components. For example, a communication channel may connect a PCI Express device to a CPU via a northbridge or host bridge.

Also in communication with the I/O adapter device 102 via the communication channel 107 may be one or more controller components 104 for managing hard drives or other forms of memory. An example of a controller component 104 can be a SATA hard drive controller. Similar to the SBIOS component 105, the controller components 104 can include or take the benefit of a hardware latch that is electrically controlled by the I/O adapter device 102. The hardware latch can restrict access to one or more aspects of the controller component 104. Illustratively, the hardware latches may be controlled together or independently. For example, the I/O adapter device 102 may selectively close a hardware latch for one or more components based on a trust level associated with a particular customer. In another example, the I/O adapter device 102 may selectively close a hardware latch for one or more components based on a trust level associated with an author or distributor of the executable code to be executed by the I/O adapter device 102. In a further example, the I/O adapter device 102 may selectively close a hardware latch for one or more components based on a trust level associated with the component itself.

The host device 100 can also include additional components that are in communication with one or more of the illustrative components associated with the host device 100. Such components can include devices, such as one or more controllers 104 in combination with one or more peripheral devices 108, such as hard disks or other storage devices.

Additionally, the additional components of the host device 100 can include another set of peripheral devices 109, such as Graphics Processing Units ("GPUs"). The peripheral devices 108 and 109 can also be associated with hardware latches for restricting access to one or more aspects of the component. As mentioned above, in one embodiment, the hardware latches may be controlled together or independently.

Figure 2:
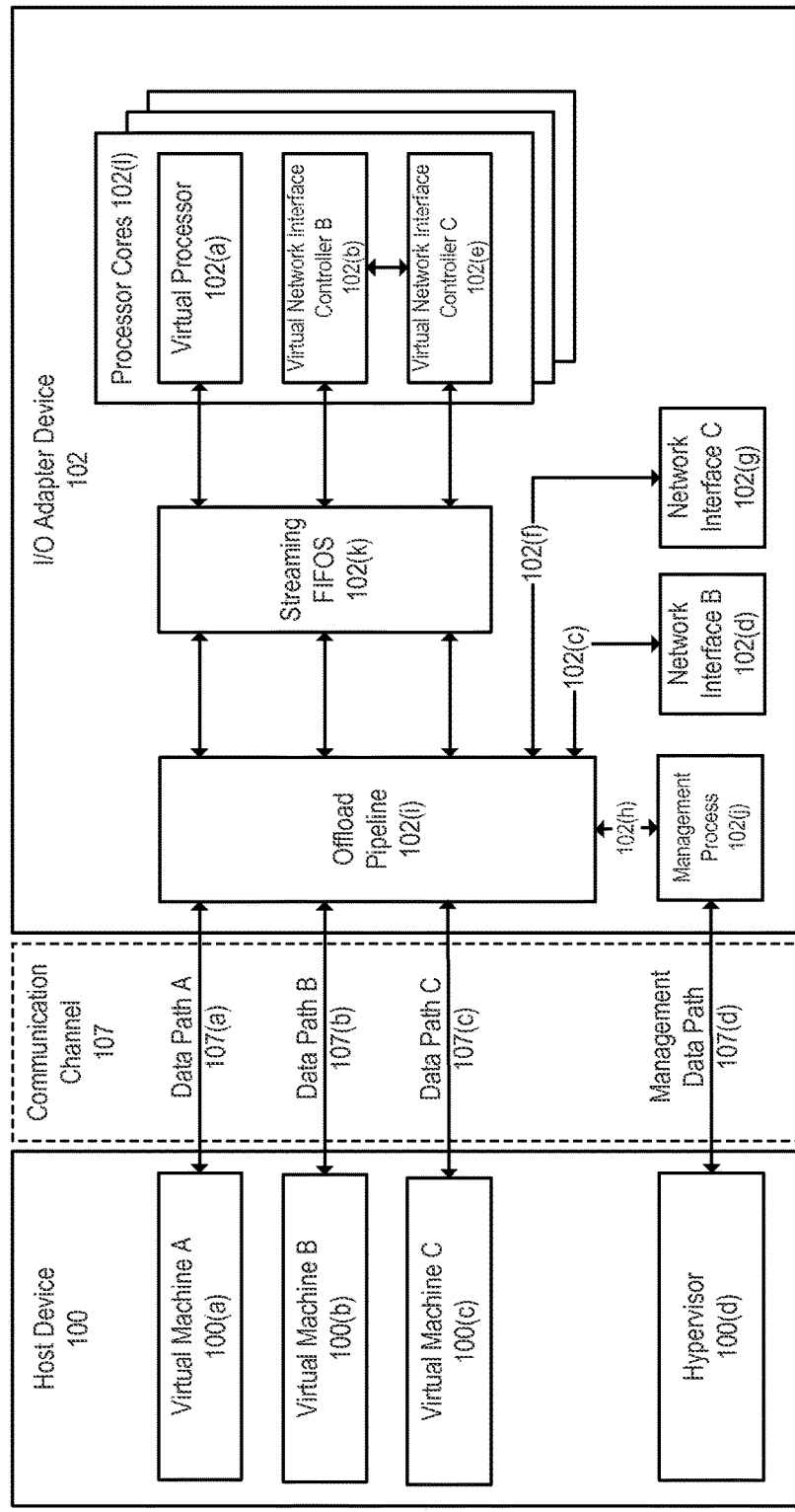
FIG. 2 illustrates one embodiment of communications between the host device and the I/O adapter device.

FIG. 2 illustrates one embodiment of communications between the host device 100 and the I/O adapter device 102. As shown in FIG. 2, the host device 100 may execute a plurality of processes, such as virtual machines A-C 100(a)-(c) and a hypervisor 100(d). The I/O adapter device 102 may include an offload pipeline 102(i) for receiving and handling requests from the virtual machines 100(a)-(c). The I/O adapter device 102 may also include one or more processor cores 102(l). The I/O adapter device 102 may emulate a plurality of devices, such as virtual processor 102(a), and virtual network interface cards 102(b), 102(e), using the processor cores 102(l). The I/O adapter device 102 may also include a management process 102(h). Each of the above-described components of the host device 100 and the I/O adapter device 102 may communicate using data paths 107(a)-(d) over communication channel 107.

Virtual machine A 100(a) may be any suitable emulation of a computer system. Virtual machine A 100(a) may be in communication with a virtual processor 102(a) via a data path A 107(a). The virtual processor 102(a) may include one or more processing elements such as microprocessors. For example, the virtual processor 102(a) may include a general purpose graphical processing unit (GP-GPU), an application-specific instruction-set processor (ASIP), or another specialized processing element that may be better suited for certain tasks (e.g., secure billing and transaction processing) than the host device 100.

Virtual machine B 100(b) may also be any suitable emulation of a computer system. Virtual machine B 100(b) may be in communication with a virtual network interface controller (NIC) B 102(b) via the data path B 107(b). The network interface B 102(d) may be any suitable interface to a computer network. In one example, the network interface B 102(d) may be a physical Ethernet port. In another example, the network interface B 102(d) may be a virtual network interface that shares the same physical Ethernet port with one or more other virtual network interfaces. Virtual machine C 100(c) may similarly be in communication with the network interface C 102(g).

The virtual machines 100(a)-(c) running on the host device 100 may be managed by a hypervisor 100(d). The hypervisor 100(d) may, for example, be configured to create, start, monitor, stop, and delete virtual machines 100(a)-(c). In addition, the hypervisor 100(d) may be configured to communicate with a management process 102(g) on the I/O adapter device 102 via a management data path 107(d). The management process 102(g) may be used to, for example, create or remove virtual devices such as the virtual offload processor 102(a), the virtual NIC B 102(b), and/or the virtual NIC C 102(e) and manage the offload pipeline 102(i) via an offload pipeline interface 102(h).

The virtual machines 100(a)-(c) may be assigned priorities. Priorities mean that the transactions initiated by one virtual machine 100(a) may take precedence over transactions initiated by another virtual machine 100(b). In some embodiments, the priorities may only take effect when the resources of the I/O adapter device 102 are heavily occupied. Priorities may take the form of service level agreements. A service level agreement may, for example, indicate an amount of resource usage permitted to a virtual machine 100(a)-(c). For example, service level agreements may indicate that a virtual machine 100(c) may only be allowed a certain amount of network bandwidth, host memory, and/or I/O adapter device 102 usage. I/O adapter device 102 usage may involve assigning a certain amount of buffer memory space to each virtual machine; thus, for example, service level agreements may indicate how much buffer memory space a virtual machine 100(a)-(c) is assigned.

Priorities may also apply to queues maintained by virtual machines 100(a)-(c). For example, in embodiments where the I/O adapter device 102 implements the Non-Volatile Memory Host Controller Interface Specification (NVMHCI, also called NVM Express or NVMe), a virtual device 102(a) may provide multiple queues, such as for example paired submission and completion queues. Commands are placed by the virtual machine 102(a) into a submission queue. Completions for those commands are placed in the associated completion queue. In some instances, the virtual device 102(a) may provide multiple submission queues. Priorities may be assigned to specific queues, or to specific queue pairs, such that transactions in one queue may take precedence over transactions in another queue. In some embodiments, priorities may not take effect until the I/O adapter device's 102 resources are heavily occupied.

Requests from the virtual machines 100(a)-(c) may be received and handled in the I/O adapter device 102 by an offload pipeline 102(i). The offload pipeline 102(i) may include a pipeline with individual units or streaming components for managing the steps to prepare and issue the requests to the network interfaces 102(d), 102(g). The offload pipeline 102(i) may also include buffer memory for intermediate storage of data associated with requests from the virtual machines 100(a)-(c). The offload pipeline 102(i) may communicate with the processor cores 102(l) and/or virtual devices 102(a), 102(b), 102(e) running on the processor cores 102(l) over one or more streaming FIFOs 102(k). In some instances, the offload pipeline 102(i) provides a fast path for servicing certain requests with lower complexity or certain aspects of the request with respect to the processor cores 102(l) executing on the I/O adapter device.

It should be noted that although certain virtual devices are shown as part of the I/O adapter device 102 of FIG. 2 (i.e., virtual processor 102(a) and virtual network interface cards B 102(d) and C 102(g)), embodiments may generally relate to any suitable virtual or physical I/O device. In addition, although in FIG. 2 virtual machines 100(a)-(c) and virtual devices 102(a), 102(b) and 102(e) have a one-to-one correspondence, in various embodiments a virtual machine may be associated with zero, one, or multiple virtual devices on an I/O adapter device. Furthermore, although FIG. 2 is described with reference to a plurality of virtual machines running on host device 100, it should be noted that in some embodiments host device 100 may run a single, non-virtualized operating system.

In an environment including server computers including I/O adapter devices, some efficiencies may be introduced by having the I/O adapter device calculate error correction values for ingress and egress data. For example, data is often stored on a storage device with an error correction value that is written with the data, and retrieved when the data is read. When the server computer is communicating with many storage devices, it may be more efficient to have the I/O adapter device calculating error correction values, rather than having each storage device calculate an error correction value each time the data is stored or read.

II. Write Requests

Figure 3:
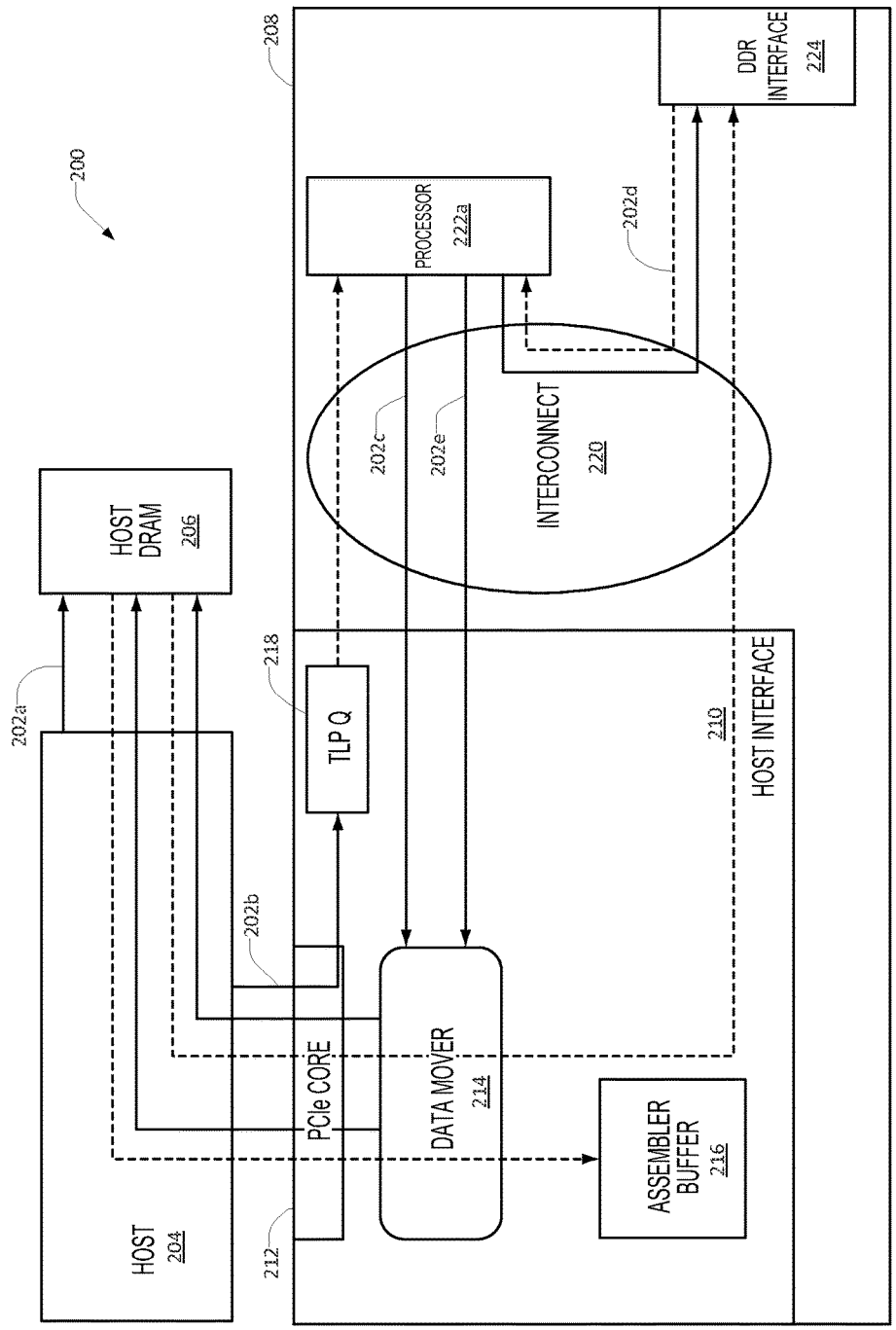
FIG. 3 illustrates one embodiment of a system for implementing a storage write request, where the write request may be targeted to a storage location.
Figure 4:
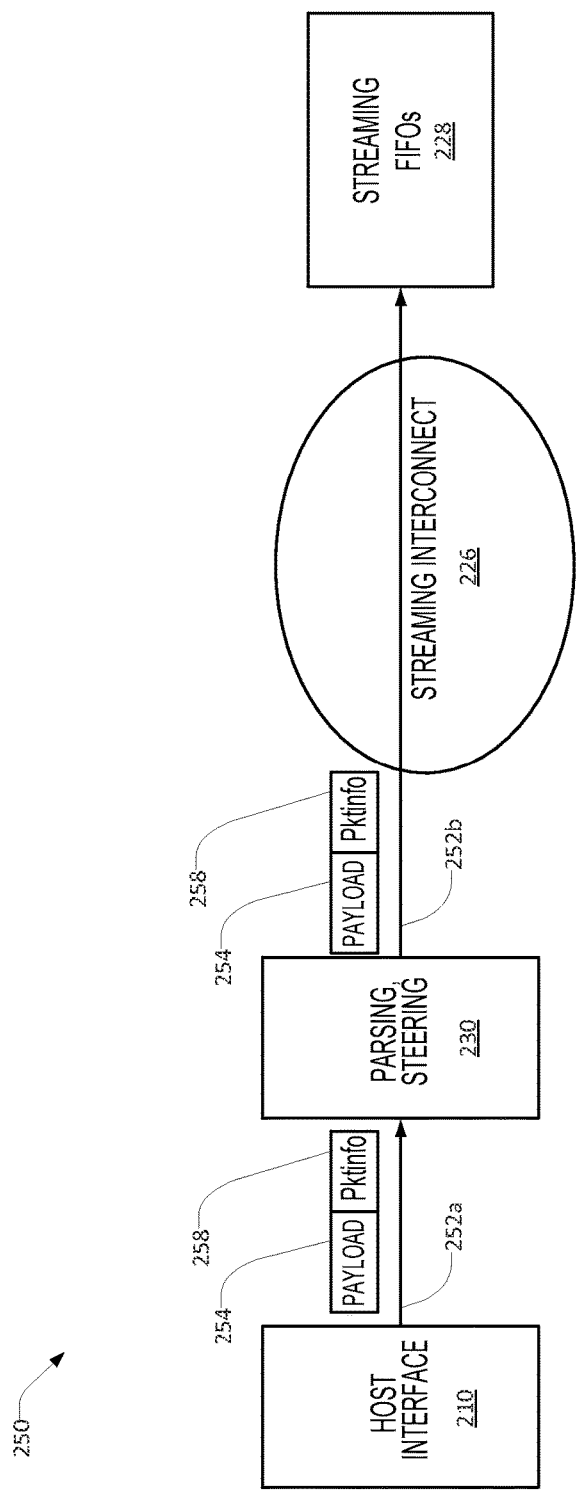
FIG. 4 illustrates one embodiment of a packet flow for moving a write packet for a write request described above through the preliminary stages of an offload pipeline.
Figure 5:
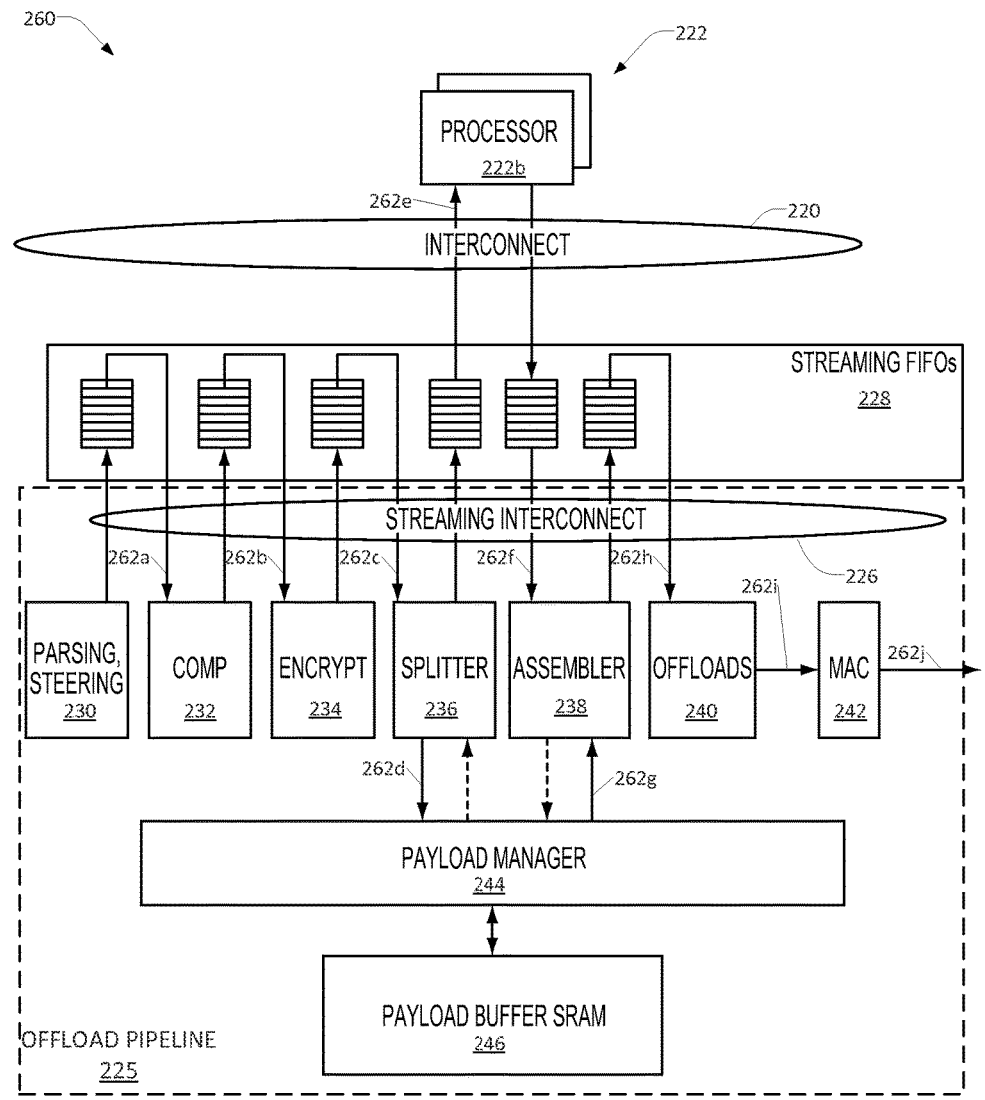
FIG. 5 illustrates one embodiment of a flow of the write packet through the offload pipeline of the I/O adapter device.

FIGS. 3-6 illustrate one embodiment of an I/O adapter device configured to process a write request. FIGS. 3-6 illustrate general and flexible write request processes, configured for most variants of write requests, special write cases, and management of errors. These figures illustrate how a write request is transferred from a virtual machine on a host device to an I/O adapter device (FIG. 3). The write request is transferred from a host interface in the I/O adapter device to the I/O adapter device's offload pipeline (FIG. 4). The write request flows through the offload pipeline, where it is processed and transmitted to a storage location (FIG. 5). A write request may receive one or more responses from the storage location. These responses also flow through, and are processed by, the offload pipeline (FIG. 6), and once all responses are received, the I/O adapter device informs the virtual machine that the write request has completed.

FIG. 3 illustrates one embodiment of a system 200 for implementing a storage write request, where the write request may be targeted to a storage location. The storage location may comprise, for example, a remote computing device, a network-attached storage device, and/or a direct-attached storage device. Remote computing devices include devices, such as for example a server computer, that an I/O adapter 208 device can communicate with over a network or series of networks. Network-attached storage devices include devices configured to store data, which the I/O adapter device 208 can communicate with over a network or series of networks. Direct-attached storage devices include storage devices directly attached to the host device 204.

Also illustrated in FIG. 3 are the initial steps to execute a write request. The write request is transferred from a virtual machine on a host device 204 to an I/O adapter device 208. In some instances, the write request originates from a virtual machine executing on the host device 204. The I/O adapter device processes the write request through an offload pipeline 225, discussed in further detail below, and transmits the write request to the targeted storage location, for example through a network interface port. The network interface port can be, for example, a 10 Gb, 25 Gb, or 50 Gb port or any other high data bandwidth interface port.

FIG. 3 illustrates one embodiment of the steps by which a write request may be transferred from a virtual machine on a host device 204 to an I/O adapter device 208. In some embodiments, the communication channel between the host 204 and the I/O adapter device 208 takes the form of a PCIe interface. In such embodiments, the host interface 210 may include a PCIe core 212. It is understood that a PCIe interface is only given as an example, and that, as explained above, the communication channel can be implemented in other forms.

As a first step, the virtual machine on the host 204 posts 202a the write request by, for example, writing the data that is to be transmitted to a buffer in host DRAM 206. The virtual machine may also write other information about the write request to host DRAM 206, such as a packet descriptor, which indicates where in the host DRAM 206 the data to be written by the write request is located.

As a second step, the virtual machine on the host 204 may notify 202b the I/O adapter device 208 that it has posted 202a the write request. In some embodiments the I/O adapter device 208 communicates with the host 204 over a PCIe communication channel. In such embodiments, the host interface 210 may include a PCIe core 212. Also in such embodiments, the notification 202b may take the form of a doorbell write. The doorbell write is steered to a Transaction Layer Packet (TLP) queue 218 that is associated with a processor 222*a*. The processor 222*a* is one of one or more processors included in some embodiments of the I/O adapter device 208. Any of the one or more processors may be designated for specific tasks, such as handling requests or specific types of requests from a specific virtual machine. For example, the processor 222*a* in this example may have been designated to handle the I/O requests from a specific virtual device. Individual processors may be implemented as ARM cores. The processors communicate with the host interface 210 through an interconnect 220. In some embodiments, such as embodiments in which the processors are implemented as ARM cores, the interconnect 220 can be an AXI interconnect.

As a third step, information about the write request is transferred from the host 204 to the I/O adapter device 208. The processor 222*a* instructs 202*c* a data mover 214 to fetch information for the write request from the host DRAM 206. For example, the data mover 214 may fetch the packet descriptor, which indicates where in the host DRAM 206 the write data is located. The packet descriptor, and/or other information about the write request, may be stored in a DDR through a DDR interface 224 on the I/O adapter device 208. In some embodiments, the processor 222*a* may have pre-fetched the packet descriptors, and thus may not need to fetch the packet descriptors at this stage.

In some embodiments, at this step, the processor 222*a* may determine a configuration for calculating an error correction value for the data being written by the write request. The processor 222*a* may make this determination here so that the determination does not need to be made later, possibly by another processor. An error correction value is a value produced by executing a calculation over a block of data. The error correction value is sent with the block of data, and may be used by the recipient of the block of data (here, the storage location) to determine whether the data was received without errors. To use the error correction value to verify the correctness of the data, the recipient of the block of data may execute the same calculation over the same block of data to also produce an error correction value. The recipient may then check its calculated error correction value against the error correction value it received with the data. When the values do not match, it is probable that there are errors in the data received by the recipient. Alternatively or additionally, the error correction value may be stored with the block of data at the storage location. The stored error correction value may be retrieved along with the data when the data is requested from the storage location (for example, with a read request). Once the data has been retrieved, the stored error correction value may then be used to verify that no errors have been introduced into the data since it was stored. The error correction value may be calculated according to any method for calculating error correction values, such as for example parity, checksum, cyclic redundancy check (CRC), or others.

In the context of the write request process of FIG. 3, the error correction value may be computed over some, all, or none of the write data. In some embodiments, at the illustrated third step, the processor 222*a* may determine which portion of the write data to use for calculating the error correction value. The portion of the data may be all data for the current write request; none of the data; or blocks of data from the write data, where the blocks are of a pre-determined size. The processor 222*a* determines a configuration that designates which portion of the data. To make this determination, the processor may consider how the I/O adapter device has been configured. For example, the I/O adapter device 208 may be configured to apply the same configuration for calculating an error correction value for all write requests. Alternatively or additionally, the I/O adapter device 208 may be configured to apply one configuration for requests from a specific virtual machine on the host 204, requests directed to a virtual device on the I/O adapter device 208, and/or requests directed to a specific queue on the I/O adapter device 208. Yet another alternative is for the I/O adapter device to apply a configuration on a per-request basis. A combination of these configurations is also possible, with any one being designated as the default.

Once the processor 222*a* has determined the configuration for calculating an error correction value, the processor 222*a* may instruct the offload pipeline 225 to calculate the error correction value according to this configuration. To do so, the processor 222*a* may include the configuration in a packet information for the write request. Packet information is described in further detail below. Alternatively or additionally, the processor 222*a* may place the configuration in a packet header for the write packet.

In some situations, the error correction value is to be calculated over data from multiple write requests. In such situations, the error correction value state is maintained between associated write requests. This situation may be indicated to the processor 222*a* at this step, for instance by the information about the write request. In some embodiments, the processor 222*a* may retrieve a saved error correction value state. The state may be stored on the I/O adapter device 208, for example in a DDR or in the payload buffer 246, or the state may be stored on the host 204, for example in the host DRAM 206. The processor 222*a* may add the state to the packet information.

Returning to the steps of FIG. 3, at a fourth step, the designated processor 222*a* may read 202*d* descriptor information from a DDR through a DDR interface 224 on the I/O adapter device 208. The descriptors stored in the DDR include information about the write request. For example, the descriptors may include the request type, the size of the data to be transferred by the request, where in the host DRAM 206 the data is located, and/or where in the I/O adapter's payload buffer the data may be temporarily stored. Descriptors may be placed in the DDR when the write request is initially transferred to the I/O adapter device. The I/O adapter device 208 may add the descriptor to a list of descriptors. The I/O adapter device 208 may maintain a list or queue of descriptors, where the list or queue is used to track requests that are being processed or will be processed in the future. For example, the write request may be added to a submission queue. Descriptors are extracted from the submission queue when the associated write request is processed. The descriptor information may indicate that more descriptors should be fetched from the host DRAM 206.

As a fifth step, the processor 222*a* may initiate a request to fetch write data from the host 204. The designated processor 222*a* may instruct 202*e* the data mover 214 to fetch the write data from the host DRAM 206. To fetch the write data host interface 210 may execute a memory access request to transfer the write data. A memory access request may take the form, for example, of a direct memory access (DMA) transaction. This DMA transaction may only transfer a portion of the write data. In some embodiments, the write data is transferred to an assembler buffer 216. The assembler buffer 216 is a memory that serves as a temporary buffer to assemble packets that will be sent to the offload pipeline 225. In some embodiments the assembler buffer may be located in another unit, such as for example in the payload manager 244, described below. Some embodiments do not include the assembler buffer 216, and the DMA transaction transfers the write data to a payload buffer 246, described below.

The processor 222a may also instruct the data mover 214 to add packet information (also called "PktInfo") to the write data. The packet information may include information about the write request, such as the identity of the virtual machine that requested the write and information about the storage device to which the write is directed. The packet information may also include information for the offload pipeline, such as commands for one or more units in the offload pipeline.

FIG. 4 illustrates one embodiment of a packet flow 250 for moving a write packet for a write request described above through the preliminary stages of an offload pipeline 225. A write packet is a unit of data that is to be transmitted to the storage location. The write packet includes a header and a payload. The header includes information about the write request, such as for instance the location where the write data is to be written, the size of the write data, and/or error correction values, among other information. The header may further include protocol information that may be required to transmit the packet. The payload contains the write data.

First, the host interface 210 may send 252a the write packet, containing the packet information 258 and packet payload 254, to a packet parsing and steering 230 unit. The packet payload 254 contains the write data fetched from the host DRAM 206. The parsing and steering unit 230 may next send 252b the packet information 258 and packet payload 254 to a designated streaming FIFO 228 by way of a streaming interconnect 226. In some embodiments, the parsing and steering unit 230 may also initiate pre-fetching of a context for the virtual machine that initiated the write request. Streaming FIFOs 228 and the streaming interconnect 226 are described in further detail below.

FIG. 5 illustrates one embodiment of a flow 260 of the write packet through the offload pipeline 225 of the I/O adapter device 208. The offload pipeline 225 may be implemented as a combination of software and hardware. The offload pipeline 225 is illustrated here, by way of example, as including a number of streaming components, such as a parsing and steering 230 unit, a compression 232 unit, an encryption 234 unit, a splitter 236 unit, an assembler 238 unit, a network offloads 240 unit, a media access control (MAC) 242 unit, a payload manager 244, and a payload buffer 246. In some implementations, such streaming components may be implemented using hardware logic, such as ASIC, Field programmable Gate Arrays (FPGA) or similar digital hardware components that allow for some configurability enabled through one or more software interfaces. In some implementations, several streaming components may be included in hardware logic as subunits in the same system-on-a-chip (SOC). The offload pipeline 225 may include additional units not illustrated here, as necessary for other operations. In some embodiments, streaming FIFOs 228 enable passing of data between the units of the offload pipeline 225 and between the offload pipeline 225 and one or more processors 222. In some embodiments, the units of the offload pipeline 225 communicate with the streaming FIFOs 228 by way of a streaming interconnect 226. In some embodiments, the units or the streaming components of the offload pipeline 225 communicate with each other through the streaming interconnect 226, and to the processors 222 through the streaming FIFOs 228, by way of the streaming interconnect 226. In some implementations, the streaming components are configured to perform one or more packet processing operations for the I/O adapter device 208 and the streaming interconnect 226 is configured to route packets through the offload pipeline 225. The processors 222 communicate with the streaming FIFOs 228 through a separate interconnect 220. Software executed by the processors 222 may operate on the packet. The operation of the offload pipeline 225 can be modified and adapted by modifying the software executed by the processors 222.

As explained above with reference to FIG. 4, and as illustrated in FIG. 5, the parsing and steering unit 230 directs the write packet to a streaming FIFO 228. From the streaming FIFO 228, the write packet's packet information and payload are passed 262a to a compression 232 unit. The compression 232 unit may compress the payload. The compression 232 unit may then pass 262b the packet information and compressed payload to an encryption 234 unit through another streaming FIFO 228. The encryption 234 unit may encrypt the payload; for example, the encryption 234 unit may include a flow based Advanced Encryption Standard-XEX-TCB-CTS (AES-XTS) encryption engine. The encryption 234 unit may pass 262c the packet information and encrypted payload to a splitter 236 unit, by way of another streaming FIFO 228. The splitter 236 unit may request 262d payload buffer space from a payload manager 244. The splitter 236 unit may then place the write data payload in the payload buffer 246 at the designated space. The payload manager 244 may return a handle to the payload buffer 246. The splitter 236 unit may place the handle in the packet information and send 262e the packet information through a streaming FIFO 228 to a processor 222b.

The processor 222b may perform protocol processing on the packet information, such as for example any necessary processing to prepare the write packet for transmission by a specific transmission protocol. The processor 222b may create a packet header for the write packet, where the packet header contains any necessary protocol information for transmitting the write packet.

The processor 222b may also update the packet information with information that the network offloads 240 unit may use to generate an error correction value. In some embodiments, the processor 222b may, at this stage, determine a configuration for calculating the error correction value. The error correction value may be computed over all, some, or none of the write data for the current write request. The processor 222b may be configured to determine which portion of the write data, if any, is to be used by the offload pipeline 225 to calculate the error correction value. The selected configuration may be added by the processor 222b to the packet information.

In some embodiments, the error correction value is to be calculated over data from multiple write requests. In such embodiments, the error correction value state is maintained between the associated write requests. The processor 222b may retrieve the saved error correction value state, for example, from the DDR through the DDR interface 224 or from the host DRAM 206. Alternatively, the processor 222b may instruct the offload pipeline 225 to retrieve a saved state from the payload buffer 246. In other embodiments, no state is maintained even between associated write requests. In such embodiments, an error correction value is calculated for each write data for each of the related write request.

Upon completion of any further processing, the processor 222b may pass 262f the packet information and packet header for the write packet to an assembler 238 unit, by way of a streaming FIFO 228.

The assembler 238 unit may request 262g the packet payload from the payload manager 244 and associate the payload with the packet information and the packet header. The buffer space used by the payload data is freed for other use. The assembler 238 unit passes 262h the packet, by way of a streaming FIFO 228, to the network offloads 240 unit. The network offloads 240 unit may perform stateless operations on the packet header and/or data, such as for instance checksum generation, UDP/IP checksum generation, and/or Ethernet CRC generation.

As described herein, embodiments may enable stateless operations on the portions of the write requests originating from a virtual machine host. "Stateless" here means that the network offloads 240 unit does not maintain state information between individual related write requests. Write requests may be related, for example, when the data written by multiple requests comprises a single set of data. When a single set of write data spans multiple write requests, an error correction value may be calculated for each write data portion written with each individual write request. Alternatively, a single error correction value for the entire write data can be calculated, in which case an error correction value state is maintained between the related write requests. In some embodiments, whether to calculate one error correction value or multiple error correction values is configurable. The configuration may be determined on a per request basis, per virtual device basis, per virtual machine basis, and/or per queue basis, depending on how the I/O adapter device 208 is configured. Any method may be employed to generate the error correction value; hence the error correction value may be, for example, a CRC or a checksum.

The network offloads 240 unit may calculate the error correction value. The network offloads 240 unit may be supplied with a configuration that indicates what portion of the write data is to be used to calculate the error correction value. In one case, the amount of data is indicated as none. In such cases, the network offloads 240 unit does not calculate an error correction value, and the write packet is transmitted without an error correction value. In such cases, the write packet may include an error correction value for the packet header, or no error correction values at all.

In another case, the amount of data is all of the data. In this case, the network offloads 240 unit uses all of the write data for the current write request to calculate the error correction value, and a single error correction value will be sent with the write packet.

In yet another case, the amount of data is blocks of data of a pre-determined size. In such cases, the write data is divided into blocks of the pre-determined size and an error correction value is calculated for each block, resulting in multiple error correction values. The pre-determined size may be configured by software or hardware. The pre-determined size may be dependent upon, for example, the protocol used to transmit and receive packets, the configuration or limitations of the storage device, the identity of the virtual machine that issued the write request (where the identity may be associated with, for example, a priority, a service level agreement, a queue, an assigned buffer location and/or size, etc.), or the requirements of the specific installation of the I/O adapter device. The pre-determined size can be configured for the whole I/O adapter device, for specific virtual devices, for specific queues, for specific priorities, for each transaction, or any combination of these configurations.

The multiple error correction values calculated for each of the write data blocks are transmitted with the write packet. The error correction values may be placed within the payload adjacent after their respective blocks, wherein adjacent may be before or after the block. This arrangement is advantageous at least because it allows the write data payload to be read sequentially by the recipient. Alternatively, the error correction values may be grouped at the end of the packet payload. This arrangement is advantageous at least because it allows the write data, which is typically of a known size, to be maintained contiguously within the payload. Yet another alternative is to place the error correction values at the beginning of the payload. This arrangement is advantageous at least because the error correction values are available to the data recipient up front, before the recipient will consider the data. The same potential advantages exist for when a single error correction value may be placed at the beginning or end of the payload, for the single value case. Alternatively, the error correction value or values may be placed in the packet header. The block size may be configurable, and/or may be determined by a hardware or firmware or software configuration. Alternatively or additionally, the block size may be determined by the transmission protocol, and/or the configuration of the storage location to which the data is being written.

In some embodiments, when the amount of data is blocks of a pre-determined size, the I/O adapter device 208 may be configured to transmit separate write transactions, where each write transaction includes a block-size amount of data and an associated error correction value.

In such embodiments, the offload pipeline 225 may be configured to divide the write data into blocks of the pre-determined size, compute an error correction value for the block of write data, and generate a write transaction, where the write transaction includes the write data block and the associated error correction value. The offload pipeline 225 will also transmit each of these write transactions. These steps may allow the I/O adapter device 208 to adjust the size of the transmitted data, for example to accommodate a transmission protocol frame size. The write packet is considered transmitted once all of the write transactions have been sent. The I/O adapter device 208 may receive one response (as described in further detail below) from the target storage location, or may receive a response for each of the write transactions.

In other embodiments, when the amount of data is blocks of a pre-determined size, the I/O adapter device 208 may be configured to process the blocks in parallel. In such embodiments, the write data may be divided into blocks of the pre-determined size, and the block may flow through the offload pipeline 225 individually, such that different units in the offload pipeline 225 are, if the unit is available, operating on different blocks at the same time. For example, the compression 232 unit may be compressing one block, while the encryption 234 unit may be encrypting one block, while the network offloads 240 unit is generate an error correction value for yet another block. This parallelism allows the I/O adapter 208 to more efficiently use available resources, including allowing the individual units to be operating on data for entirely different requests. At the end of the offload pipeline 225 the blocks may be collected and transmitted together in a single write packet. In some embodiments, the payload (containing the write data) and the header may also be decoupled and operated on in parallel, with or without the write data being divided into blocks.

In some embodiments, as described above, an error correction value state may be maintained between related write requests. In such embodiments, the state is updated after the network offloads 240 unit calculates the error correction value, or the last error correction value, in the case where multiple values are to be calculated. The error correction value state may then be stored. For example, the state may be stored in the DDR or in the payload buffer 246. Alternatively, the state may be stored in the host DRAM 206. In some embodiments, a processor 222b may be called upon to store the state.

In some embodiments, the network offloads 240 unit also computes an error correction value for the packet header. An error correction value for the header provides similar advantages as does an error correction value for the write data; that is, it allows the target storage location to determine whether the header acquired errors in transit. The network offloads 240 unit may use the same computation or a different computation to produce the error correction value for the packet header. The error correction value for the header may be placed in the header.

Upon completion of any operations, stateless or otherwise, the network offloads 240 unit will remove the packet information from the write packet, and send 262i the now completed write packet to a MAC 242 unit for transmission 262j to the storage location.

Figure 6:
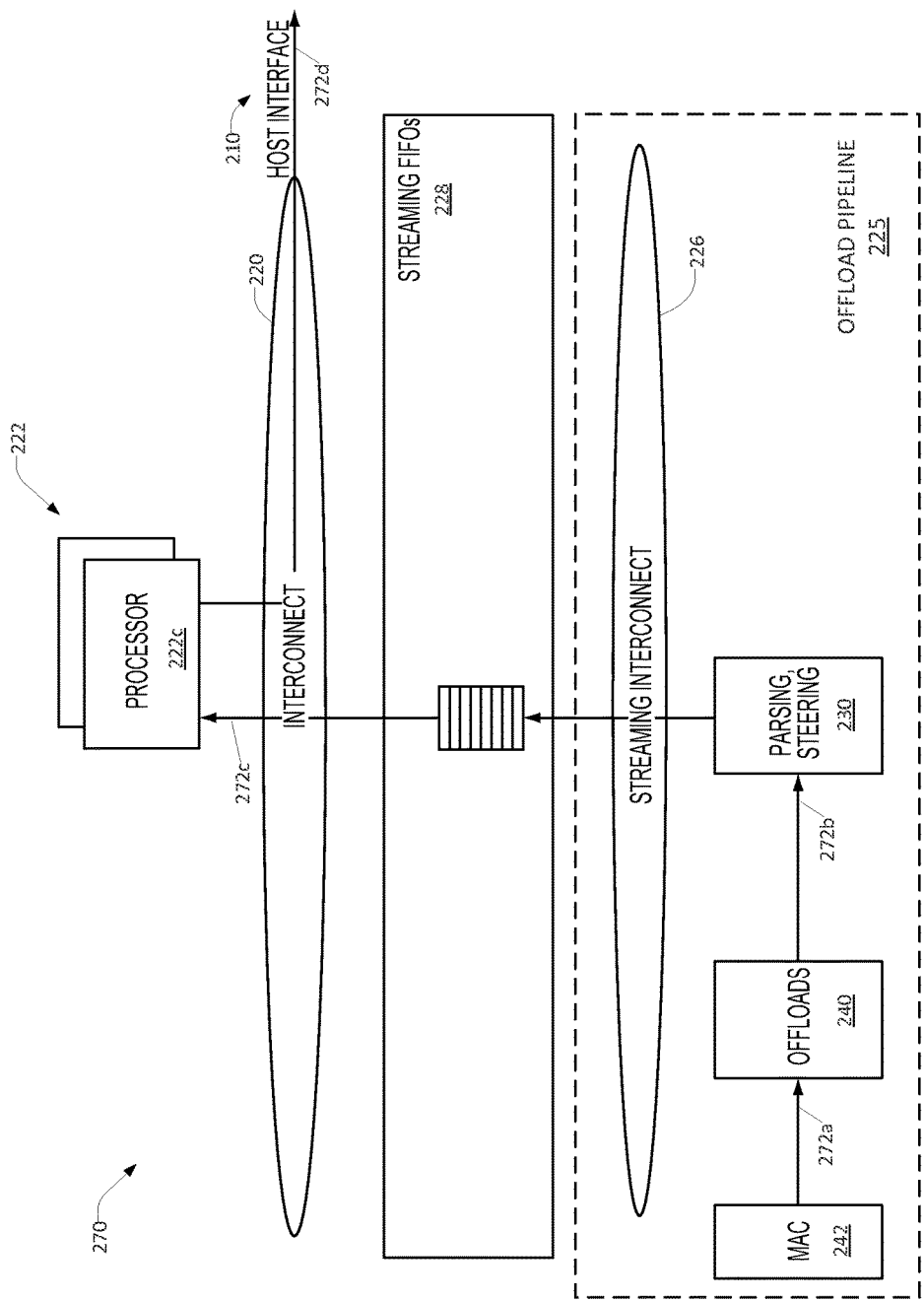
FIG. 6 illustrates one embodiment of a flow of a write response for a write request through the offload pipeline of the I/O adapter device.

FIG. 6 illustrates one embodiment of a flow 270 of a write response for a write request through the offload pipeline 225 of the I/O adapter device 208. The offload pipeline 225 is illustrated here, by way of example, as including a MAC 242 unit, a network offload 240 unit, and a parsing and steering 230 unit. The offload pipeline 225 may include additional units not illustrated here, as necessary for other operations.

The write response may be sent by the storage location to which the write request was directed, and indicates that the write has completed. In some cases, the write response may indicate that an error occurred. In such cases, a processor 222c may examine the error and determine what, if anything, to do. In some cases, the processor 222c may inform the virtual machine that requested the write that an error occurred. In some embodiments, the processor 222c may handle the error and/or reissue the write request. In other embodiments, the offload pipeline 225 may be configured to reissue the write request without assistance from the processors 222c.

The flow 270 illustrated in FIG. 6 gives an example of a write response indicating that the write was successful. The write response packet for the write request is first received from the transmission medium at the MAC 242 unit. The MAC 242 unit passes 272a the response packet to the network offloads 240 unit. The network offloads 240 unit may perform stateless operations on the response packet, such as for instance checking an Ethernet CRC, IP or UDP checksum, or other error correction value included in the response packet. A write response packet typically (though not always) does not include a payload. Thus in some cases, the write response packet may include only an error correction value for the header, or no error correction values at all. Any results of the stateless operations may be added to a packet information that is generated for the response packet. The network offloads 240 unit passes 272b the response packet to the parsing and steering 230 unit.

The parsing and steering 230 unit parses the packet header for the response packet and may determine that the response packet should be routed to a particular processor 222c that is associated with ingress traffic. The parsing and steering unit 230 will therefore place the packet header and packet information in a streaming FIFO 228, from which it will be passed 272c to the processor 222c. In some embodiments parsing and steering 230 unit may also start pre-fetching a context state for the virtual machine that requested the write.

The processor 222c may process the packet header and packet information. For example, the processor 222c may perform protocol processing, such as network protocol processing, using the packet header, packet information, and context, as well as any other information that was attached to the write request. The processor 222c may issue 272d a completion request to the host interface 210. The completion request contains sufficient information for the host interface 210 to inform the virtual machine that requested the write that the write completed successfully.

The processes described above with respect to FIGS. 3-6 provide several advantages to the server computer system described in FIG. 1. For example, the server computer may be in communication with multiple target storage locations. Each storage location may be configured to store data with an error correction value. For example, a storage location may store an error correction value for each 4 KB block of data. By having the I/O adapter device calculate the error correction value, the storage locations may no longer have to do this computation themselves. The processes above thus may provide the systems with more efficient error correction value calculation.

III. Read Requests

Figure 7:
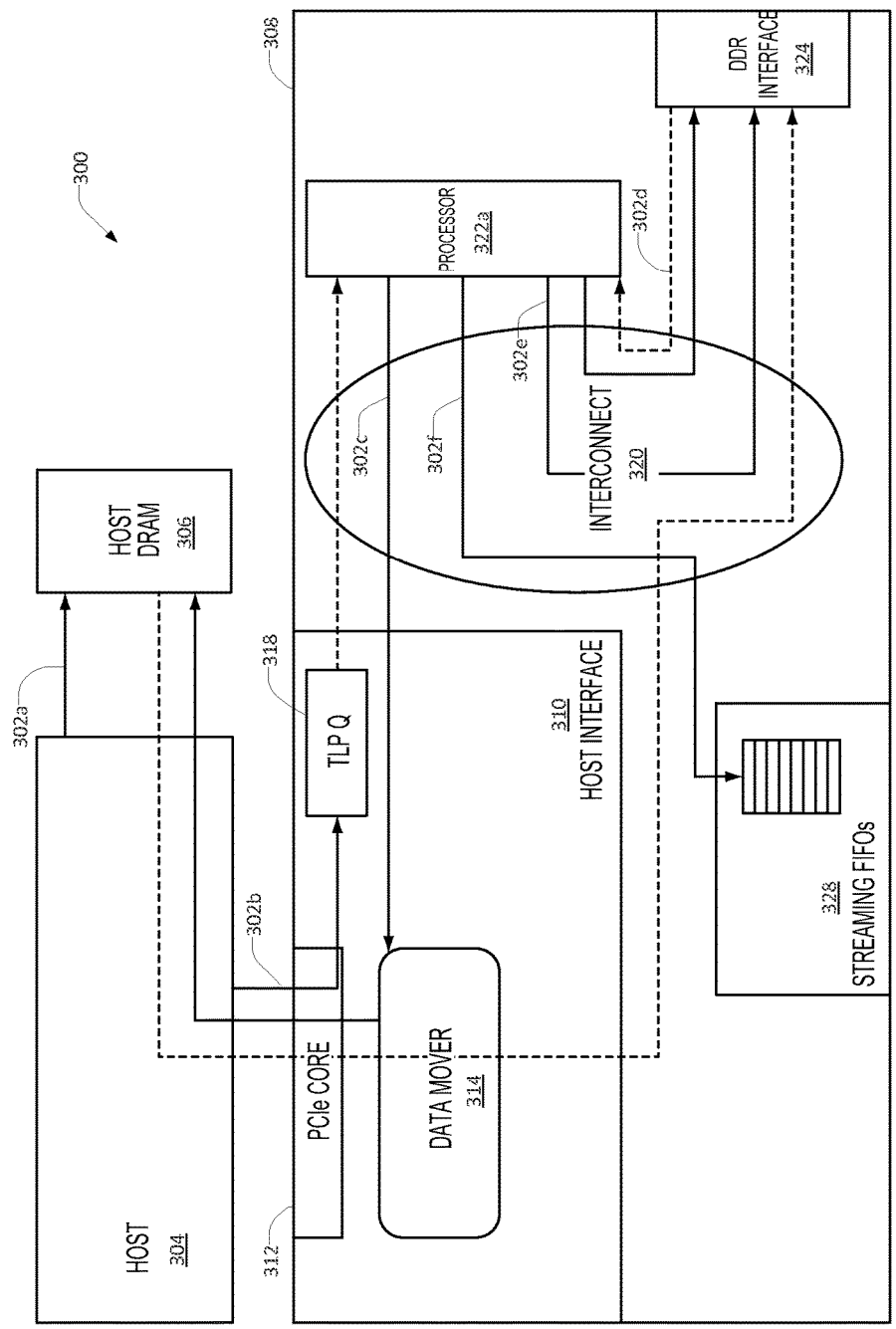
FIG. 7 illustrates one embodiment of a system for implementing a storage read request, where the read request may be targeted to a storage location.
Figure 8:
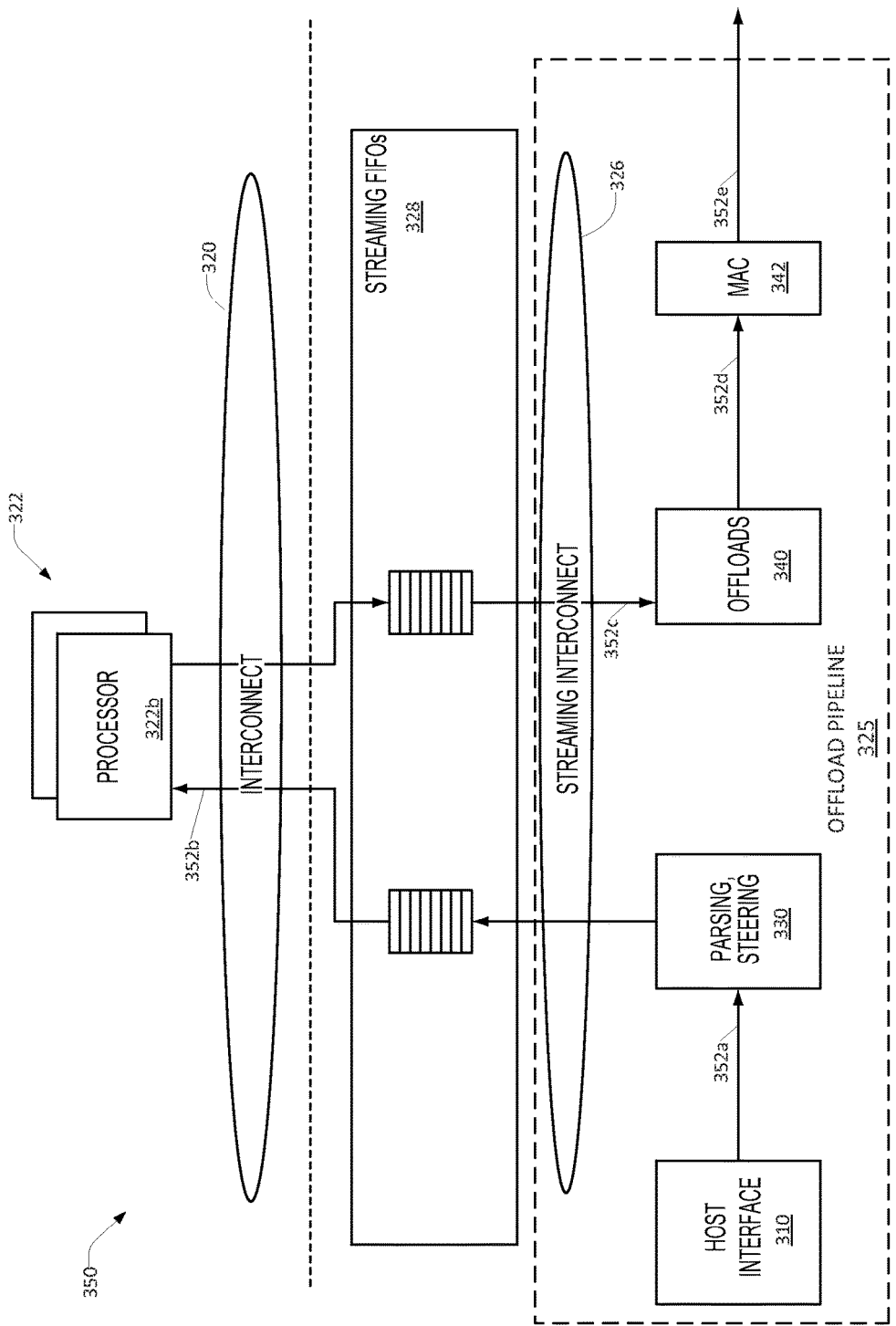
FIG. 8 illustrates one embodiment of a flow for moving a read packet for a read request through an offload pipeline.
Figure 9:
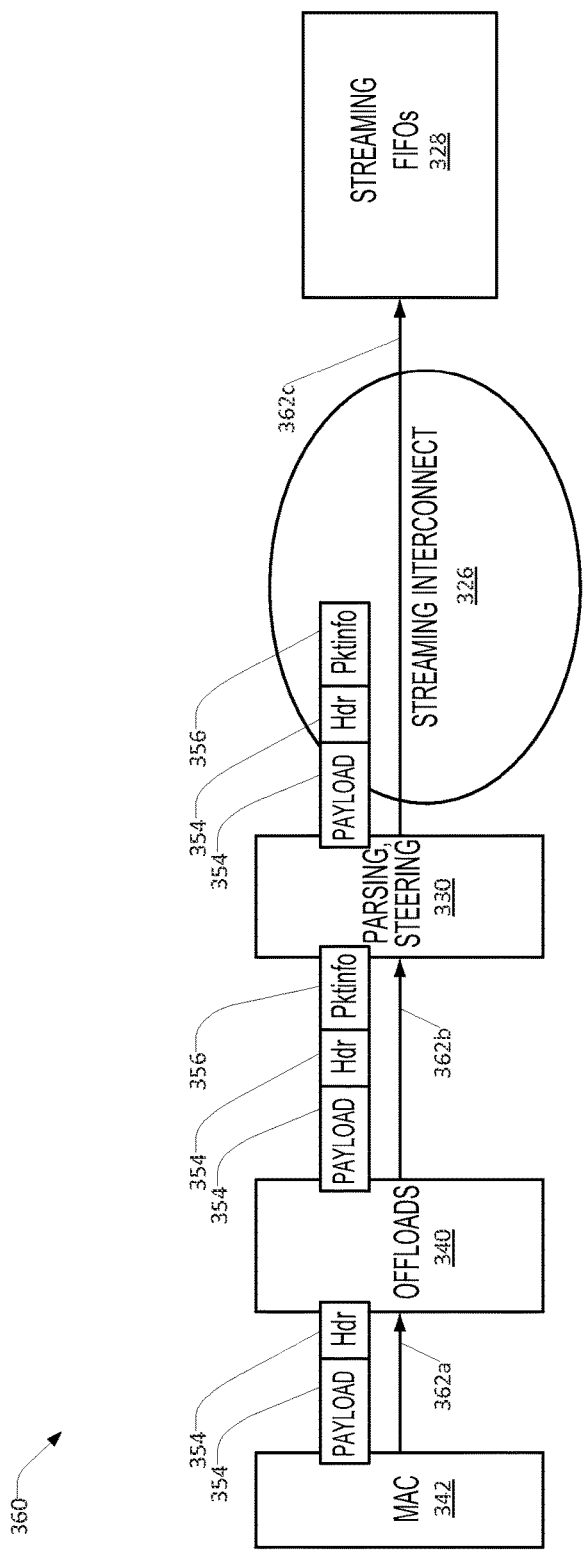
FIG. 9 illustrates one embodiment of a packet flow for receiving a response to a read request.

FIGS. 7-10 illustrate one embodiment of an I/O adapter device configured to process a read request. FIGS. 7-10 illustrate general and flexible read request processes, configured for most variants of read requests, special read cases, and management of errors. These figures illustrate how a read request is transferred from a virtual machine on a host device to an I/O adapter device (FIG. 7). The read request flows through the I/O adapter device's offload pipeline, where it is processed and sent to a storage location (FIG. 8). A read request may receive one or more response packets from the storage location. These response packets are transferred from the network interface to the I/O adapter device's offload pipeline (FIG. 9). The read response packets flow through the offload pipeline, where they are processed (FIG. 10), and once all the response packets are received, the I/O adapter device informs the virtual machine that the read request has completed.

FIG. 7 illustrates one embodiment of a system 300 for implementing a storage read request, where the read request may be targeted to a storage location. The read request may be targeted to a storage device, such as a remote computing device, a network attached storage device, and/or a direct-attached storage device.

Also illustrated in FIG. 7 are the initial steps to execute a read request. The read request is transferred from a virtual machine on a host device 304 to an I/O adapter device 308. In some instances, the read request originates from a virtual machine executing on the host device 204. The I/O adapter device processes the read request through an offload pipeline 225, discussed in further detail below, and transmits the read request to the targeted storage location, for example through a network interface port.

FIG. 7 illustrates one embodiment of the steps by which a read request may be transferred from a virtual machine on a host device 304 to an I/O adapter device 308. In some embodiments, the communication channel between the host 304 and the I/O adapter device 308 takes the form of a PCIe interface; in such embodiments, the host interface 310 may include a PCIe core 312.

As a first step, the virtual machine on the host device 304 posts 302a a read request by, for example, allocating read buffer space in the host DRAM 306. The data being read is to be placed in this read buffer space. The virtual machine may also write other information about the read request to host DRAM 306, such as a packet descriptor, which indicates where in the host DRAM 306 the read buffer space is located.

As a second step, the virtual machine on the host 304 may notify 302b the I/O adapter device 308 that it has posted 302 the read request. In some embodiments the I/O adapter device 308 communicates with the host 304 over a PCIe communication channel. In such embodiments, the notification 302b may take the form of a doorbell write. The doorbell write is steered to a Transaction Layer Packet (TLP) queue 318 that is associated with a processor 322a. The processor 322a is one of one or more processors included in some embodiments of the I/O adapter device 308. Any of the one or more processors may be designated for specific tasks, such as handling I/O requests from a specific virtual device. Individual processors may be implemented as ARM cores. The processors communicate with the host interface 310 through an interconnect 320. In some embodiments, such as embodiments in which the processors are implemented as ARM cores, the interconnect 320 can be an AXI interconnect.

As a third step, information about the read request is transferred from the host 304 to the I/O adapter device 308. The processor 322a may instruct 302c a data mover 314 to fetch information about the read request from the host DRAM 306. For example, the data mover 314 may fetch the packet descriptor, which indicates where in the host DRAM 306 the data to be read is to be placed. The packet descriptor, and/or other information about the write request, may be placed in a DDR through a DDR interface 324 on the I/O adapter device 308. In some embodiments, the processor 322a may have pre-fetched the packet descriptors, and thus not need to fetch the packet descriptors at this stage.

Quite often the requested read data is returned to the I/O adapter device with an error correction value. Typically, the storage location returning the data determines a configuration for calculating the error correction value. In some embodiments, however, at this step, the processor 322a may determine a configuration for calculating an error correction value. This configuration may be sent to the storage location to instruct the storage location how to calculate the error correction value for the requested read data. This error correction value will accompany the read data in a read response packet (described in further detail below). The error correction value may be computed over some, all, or none of the read data. In some embodiments, at the illustrated third step, the processor 322a may determine which portion of the read data to use for calculating the error correction value. The processor 322a may make this determination here so that the determination does not need to be made later, by another processor. The configuration may indicate that the error correction value is to be calculated over all data for the current read request, none of the data, or blocks of data from the read data, where the blocks are of a pre-determined size. The processor 322a determines a configuration that designates which portion of the data.

In some embodiments, the storage location determines for itself what configuration it will use to calculate the error correction value. Alternatively or additionally, the storage location may have been pre-configured with the configuration to use. In such embodiments, the processor 322a may skip making this determination.

Once the processor 322a has determined the configuration for calculating an error correction value, the processor 322a may instruct the offload pipeline 3225 to include the configuration in the header for the read packet, for transmission to the storage location. To do so, the processor 322a may include the configuration in a packet information for the read request. Packet information is described in further detail below.

In some situations, the error correction value is to be calculated over data from multiple read requests. In such situations, the error correction value state is maintained between associated read requests. This situation may be indicated to the processor 322a at this step, for instance by the information about the read request. In some embodiments the processor 322a may retrieve a saved error correction value state. The state may be stored on the I/O adapter device 308, for example in DDR or in the payload buffer 346, or the state may be stored on the host 304, for example in the host DRAM 306. The processor 322a may add the state to the packet information.

Returning to the steps of FIG. 7, at a fourth step, the designated processor 322 may read 302d descriptor information from DDR through the DDR interface 324 on the I/O adapter device 308. The descriptors stored in the DDR include information about the read request. For example, the descriptors may include the request type, the size of the data to be transferred by the request, where the data is to be placed in the host DRAM 306, and/or where in the I/O adapter's payload buffer the data may be temporarily stored. Descriptors may be placed in the DDR through the DDR interface 324 when the read request is initially transferred to the I/O adapter device 308. The I/O adapter device 308 may add the descriptor to a list of descriptors. For example, the read request may be added to a submission queue. The descriptor information may indicate that more descriptors should be fetched from the host DRAM 306.

As a fifth step, the processor 322a may record 302e, through the DDR interface 324, information about the read request. For example, the processor 322a may record 302e where the read data for the read request should be placed in the host DRAM 306. In some embodiments, the processor 322a may also generate instructions for the data mover 314 with this same information.

As a sixth step, the processor 322a may form packet information ("PktInfo") and place 302f the packet information in a streaming FIFO 328 that may be associated with egress transactions. The packet information may contain information about the read request, such as the identity of the virtual machine that requested the read and storage access information for the storage location that contains the data to be read.

FIG. 8 illustrates one embodiment of a flow 350 for moving a read packet for a read request through an offload pipeline 325. A read packet is a unit of data that is to be transmitted to the storage location. The read packet includes a header and a payload. The header includes information about the read request, such as for instance the location where the read data is to be read, the size of the read data, and/or error correction values, among other information. The header may further include protocol information that may be required to transmit the packet. The payload may be empty, or may include auxiliary information to be sent to the storage location.

The read packet is processed by the offload pipeline 325 and is transmitted to the storage location. The offload pipeline 325 is illustrated here, by way of example, as including a host interface 310, a parsing and steering 330 unit, a network offloads 340 unit, and a MAC 342 unit. In some implementations, several streaming components may be included in hardware logic as subunits in the same SOC. The offload pipeline 325 may include additional units not illustrated here, as necessary for other operations. In some embodiments, streaming FIFOs 328 enable passing of data between the units of the offload pipeline 325, and between the offload pipeline 325 and one or more processors 322. In some embodiments, the units of the offload pipeline 325 communicate with the streaming FIFOs 328 by way of a streaming interconnect 326. In some embodiments, the units or the streaming components of the offload pipeline 325 communicate with each other through the streaming interconnect 326, and to the processors 322 through the streaming FIFOs 328 by way of the streaming interconnect 326. In some implementations, the streaming components are configured to perform one or more packet processing operations for the I/O adapter device 308 and the streaming interconnect 326 is configured to route packets through the offload pipeline 325. The processors 322 communicate with the streaming FIFOs 328 through a separate interconnect 320. Software executed by the processors 322 may operate on the packet. The operation of the offload pipeline 325 can be modified and adapted by modifying the software executed by the processors 322.

As explained above with reference to FIG. 7, and as illustrated in FIG. 8, the host interface 310 will send 352a the packet information to a parsing and steering 330 unit. The parsing and steering 330 unit may parse the packet information and determine that the read packet should be routed to a particular streaming FIFO 328. The particular streaming FIFO 328 may be associated with egress data for the virtual machine that requested the read. The parsing and steering 330 unit communicates with the streaming FIFOs 328 by way of a streaming interconnect 326. In some embodiments the parsing and steering 330 unit may also initiate prefetching of a context that is associated with the virtual machine that requested the read.

The parsing and steering 330 unit may pass 352b the packet information for the read request to a processor 322b by way of a streaming FIFO 328. The processor 322b accesses the streaming FIFOs 328 through an interconnect 320. In some embodiments, the processors 322 are implemented as ARM cores. In such embodiments, the interconnect 320 may be an AXI interconnect. The processor 322b may perform operations on the packet information, such as for instance network protocol processing. The processor 322 may generate a packet header, which includes any necessary network protocol information.

The processor 322b may also update the packet header with a configuration for calculating an error correction value. In some embodiments, the processor 322b may, at this stage, determine a configuration for calculating the error correction value. The error correction value may be computed over all, some, or none of the read data for the current read request. The processor 322b may be configured to determine which portion of the read data, if any, is to be used by the offload pipeline 325 to calculate the error correction value. The selected configuration may be added by the processor 322b to the packet header.

In some embodiments, the error correction value is to be calculated over data from multiple read requests. In such embodiments, the error correction value state is maintained between the associated read requests. The processor 322b may retrieve the saved error correction value state, for example, from DDR or from the host DRAM 306. Alternatively, the processor 322b may instruct the offload pipeline 325 to retrieve a saved state from the payload buffer 346.

In other embodiments, no state is maintained between associated write requests. In such embodiments, an error correction value is calculated for each read data for each read request. In some embodiments, the error correction value state may be included in the packet header or packet payload.

In some embodiments, the network offloads 340 unit also computes an error correction value for the packet header. An error correction value for the header allows the target storage location to determine whether the header acquired errors in transit. The network offloads 340 unit may use the same computation or a different computation to produce the error correction value for the packet header. The error correction value for the header may be placed in the header.

Upon completion of any further processing, the processor 322b may pass 352c the packet information and packet header to a network offloads 340 unit.

The network offloads 340 unit may perform operations on the packet information and/or packet header. For example, the network offloads 340 unit may perform stateless operations, such as Ethernet CRC generation, UDP or IP checksum generation, or any other checksum generation. The network offloads 340 unit may further remove the packet information and send 352d the now completed packet to a MAC 342 unit. The MAC 342 unit may then send 352e the packet out onto the network.

FIG. 9 illustrates one embodiment of a packet flow 360 for receiving a response packet to a read request. A read response packet may be sent by the storage location to which a read request was directed. In some situations, multiple read response packets may be sent, each containing a part of the total read data. The read response packet may indicate that the read request reached the target storage location successfully, and that the read response packet includes the requested data. Alternatively, the read response packet may indicate that an error occurred. In such cases, a processor 322c may examine the error. In some cases, the processor 322c may inform the virtual machine that requested the read that an error occurred. In some cases, the processor 322c may handle the error and/or reissue the read request. In other cases, the offload pipeline 325 may be configured to reissue the read request without assistance from the processors 322c.

A read response packet will be received by the MAC 342 unit. The read data may arrive in multiple response packets. As each read response packet arrives, the read data associated with each response packet will be sent to the host DRAM 306, for instance, by initiating a DMA write to the host DRAM 306. The partial read data will not usually be stored on the I/O adapter device 308.

When the MAC 342 unit receives a read response packet, it will pass 362a the packet payload 354 and packet header 356 to the network offloads 340 unit. The network offloads 340 unit may perform operations on the packet, such as for instance stateless operations, including checking an Ethernet CRC, an IP or UDP checksum, or any other checksum.

As explained above, "stateless" here means that the network offloads 340 unit does not maintain state information between the individual related read requests. Read requests may be related, for example, when the data being read by multiple requests comprises a single set of data. When a single set of read data spans multiple read requests, an error correction value may be calculated for each portion of the read data returned with each read response packet. Alternatively, a single error correction value may be calculated, in which case an error correction value state is maintained between the related read requests. In some embodiments, whether to calculate a one or multiple error correction values is configurable. The configuration may be determined on a per request basis, per virtual device basis, per virtual machine basis, and/or per queue basis, depending on how the I/O adapter device 308 is configured.

The network offloads 340 unit may calculate the error correction value, and verify whether the calculated error correction value matches one received with the read data. The network offloads 340 unit may be supplied with a configuration that indicates what portion of the read data is to be used to calculate the error correction value. For example, the response packet header may include the configuration. In some embodiments, the configuration was provided by the I/O adapter device 308 to instruct the storage location what portion of the read data to use in calculating the error correction value. In other cases, the storage location determines for itself what portion of the data to use. In yet other cases, the storage location does not calculate the error correction value and instead returns an error correction value that was stored with the data. In all cases a configuration in the response packet, for example in the header, indicates what portion of the data was used. In one case, the amount of data is indicated as none. In such cases, no error correction value is included with the response packet and the network offloads 340 unit does not calculate an error correction value. In this case, the read data is not checked for correctness. In another case, the amount of data is all of the data. In this case, the response packet includes one error correction value, and the network offloads 340 unit uses all of the read data to calculate the error correction value to check against the received error correction value.

In yet another case, the amount of data is blocks of data of a pre-determined size. In such cases, the read data is divided into blocks of the pre-determined size and the response packet includes an error correction value is for each block. The pre-determined size may be configured by software or hardware. The pre-determined size may be dependent upon, for example, the protocol used to transmit and receive packets, the configuration or limitations of the storage device, the identity of the virtual machine that issued the write request (where the identity may be associated with, for example, a priority, a service level agreement, a queue, an assigned buffer location and/or size, etc.), or the requirements of the specific installation of the I/O adapter device. The pre-determined size can be configured for the whole I/O adapter device, for specific virtual devices, for specific queues, for specific priorities, for each transaction, or any combination of these configurations.

The multiple error correction values included for each of the read data blocks may be placed within the payload immediately after their respective blocks. This arrangement is advantageous at least because it allows the read data to be read sequentially. Alternatively, the error correction values may be grouped at the end of the packet payload. This arrangement is advantageous at least because it allows the read data, which is typically of a known size, to be maintained contiguously within the response packet payload. Yet another alternative is for the error correction values to be placed at the beginning of the packet payload. This arrangement is advantageous at least because the error correction values are available to the data recipient up front, before the recipient will consider the data. The block size may be configurable, and/or may be determined by a hardware or firmware or software configuration. Alternatively or additionally, the block size may be determined by the transmission protocol, and/or the configuration of the storage location to which the data is being written. The network offloads 340 unit may divide the read data into blocks of the pre-determined size, and calculate an error correction value for each block. The network offloads 340 unit may then check the calculated error correction value against the respective received error correction value for the block.

In some embodiments, as described above, an error correction value state may be maintained between related read requests. In such embodiments, the state is updated after the network offloads 340 unit calculates the error correction value, or the last error correction value, in the case where multiple values are to be calculated. The error correction value state may then be stored. For example, the state may be stored in DDR through the DDR interface 324 or in the payload buffer 346. Alternatively, the state may be stored in the host DRAM 306. In some embodiments, a processor 322*b* may be called upon to store the state.

In some embodiments, the network offloads 340 unit also verifies the error correction value for the response packet header. In such embodiments, the response packet header includes an error correction value. The network offloads 340 unit may compute an error correction value for the data in the header, and compare this calculated value against the received error correction value. This allows the I/O adapter device 308 to check whether the response packet header arrived with any errors. The network offloads 340 may use the same computation or a different computation than the one it uses to check the read data.

Upon completion of any operations, stateless or otherwise, the network offloads 340 unit may place the result of such operations in the packet information 358. The network offloads 340 unit may then pass 362*b* the payload 354, header 356, and packet information 358 to the parsing and steering 330 unit.

The parsing and steering 330 unit may parse the packet header and determine that the packet should be routed to a particular streaming FIFO 328 that is associated with ingress traffic. The parsing and steering 330 unit may add information to the packet information 358 before directing 352*c* the packet to a streaming FIFO 328 by way of the streaming interconnect 326. In some embodiments, the parsing and steering 330 unit may also initiate prefetching of a context associated with the virtual machine that requested the read.

Figure 10:
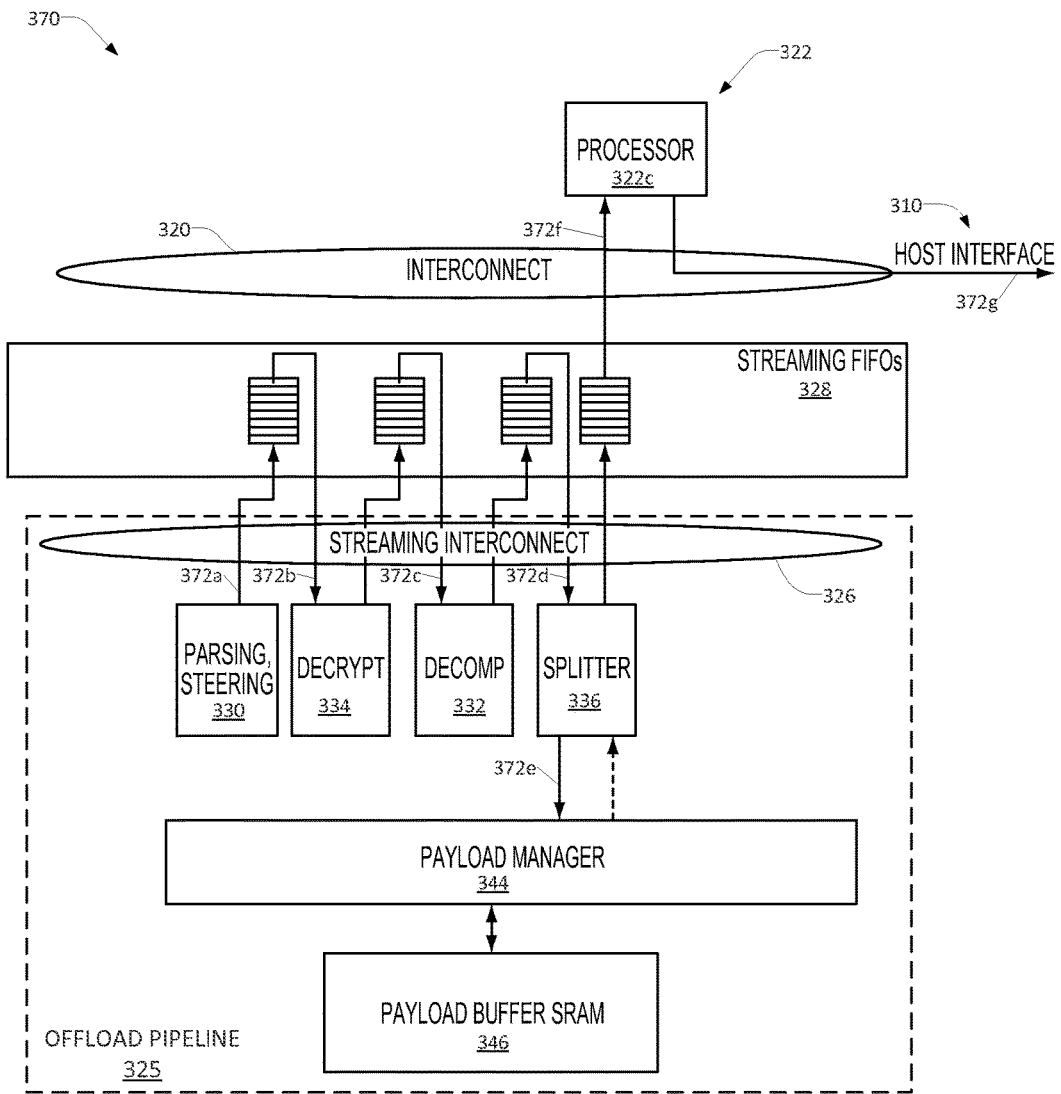
FIG. 10 illustrates one embodiment of a flow of the read response for a read request through the offload pipeline of the I/O adapter device.

FIG. 10 illustrates one embodiment of a flow 370 of the read response packet for a read request through the offload pipeline 325 of the I/O adapter device 308. The offload pipeline 325 is illustrated here, by way of example, as including a parsing and steering 330 unit, a decryption 334 unit, a decompression 332 unit, a splitter 336 unit, a payload manager 344, and a payload buffer 346. The offload pipeline 325 may include additional units not illustrated here, as necessary for other operations. Streaming FIFOs 328 pass data between the units of the offload pipeline 325, and between the offload pipeline 325 and one or more processors 322. The units of the offload pipeline 325 communicate with the streaming FIFOs 328 by way of a streaming interconnect 326. The processors 322 communicate with the streaming FIFOs 328 through a separate interconnect 320.

The read response packet may be sent by the storage location to which the read request was directed, and includes the requested read data. In some cases, the read response packet may indicate that an error occurred. In such cases, a processor 322*c* may examine the error and determine what, if anything, to do. In some cases, the processor 322*c* may inform the virtual machine that requested the read that an error occurred. In some embodiments, the processor 322*c* may handle the error and/or reissue the read request. In other embodiments, the offload pipeline 325 may be configured to reissue the read request without assistance from the processors 322*c*.

The flow 370 illustrated in FIG. 10 gives an example of a read response packet indicating that the read was successful. The read response packet is received by the offload pipeline 325 as described with respect to FIG. 9, where the response packet is last seen being passed from the parsing and steering 330 unit to a streaming FIFO 328. FIG. 10 also illustrates the parsing and steering 330 unit passing 372a the packet payload, packet header, and packet information to a streaming FIFO 328. The parts of the response packet are directed 372b to a decryption 334 unit. The decryption 334 unit may decrypt the packet payload. For example, the decryption 334 unit may include an AES-XTS decryption module. After decryption, the decryption 334 unit sends 372c the packet to the decompression 332 unit through a streaming FIFO 328. The decompression 332 unit may perform decompression on the decrypted read data payload. The decompression 332 unit sends 372d the decompressed read data payload to the splitter 336 unit by way of a streaming FIFO 328. The splitter 336 unit may request 372e buffer space for the read data payload. The payload manager 344 may return a handle to the payload buffer 346, where the handle indicates where the read data payload is to be written in the payload buffer 346. The splitter 336 unit uses the handle to write the read data payload to the payload buffer 346, and sends 372f the packet header to a processor 322 by way of a streaming FIFO 328.

A processor 322c may operate on the packet header. For example, the processor 322c may execute protocol processing, such as network protocol processing, on the packet header. The processor 322c may then notify the host interface 310 that the read data payload should be transferred 372g from the payload buffer 346 to the host DRAM 306. In some embodiments, the processor 322a may instruct the host interface 310 to execute a DMA request. The host interface 310 may execute the DMA request to transfer 372g the read data from the payload buffer 346 to the host DRAM 306. The DMA request may also contain information for the host interface 310 to perform completion actions, where the completion actions notify the virtual machine that requested the read that the read is complete.

In some embodiments, the processor 322 may recognize that the response packet contained only a frame-size amount of data, which may happen when the data requested by the read request was larger than a pre-determined frame size. When such is the case, the sender of the read response packet may send multiple, frame-size read response packets containing equal to or less than a frame-size amount of data. The processor 322 may in such cases be configured to expect multiple frame-size read response packets for a single read request, and will initiate DMA requests to transfer the frame-size read data from each of these response packets to the host DRAM 306. The processor 322 may further not treat the read request as completed until all the frame-size read response packets have been received.

The processes described above with respect to FIGS. 7-10 provide several advantages to the server computer system described in FIG. 1. For example, the server computer may be in communication with multiple target storage locations. Each storage location may be configured to calculate error correction values differently. The I/O adapter device is able to dynamically adjust to these differences without requiring the storage locations to behave differently. Additionally, by providing an error correction value configuration in the read packet header, for storage locations that support this, the I/O adapter device is able to flexibly adjust the amount of data used for the calculation. The processes above thus may provide the systems with more efficient and flexible error correction value calculation.

Figure 11A:
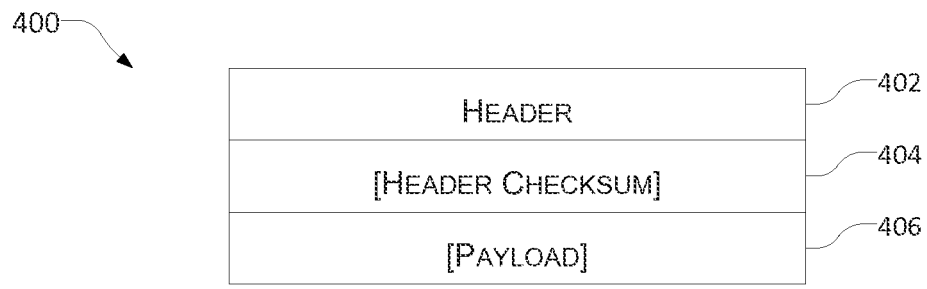
FIGS. 11A-11C provide examples of packet formats.
Figure 11B:
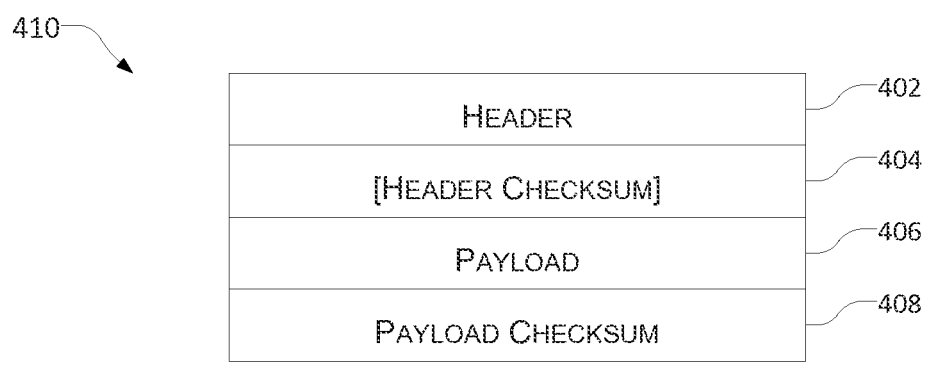
Figure 11C:
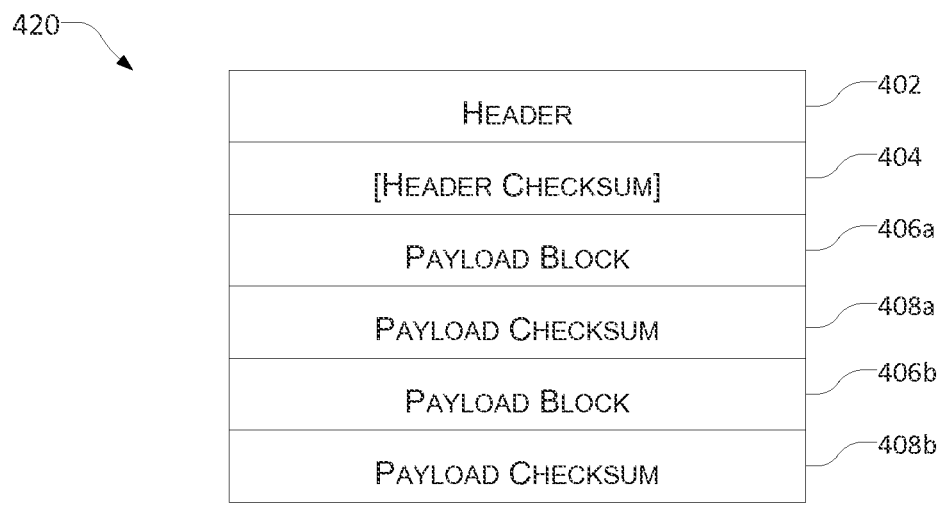

FIGS. 11A-11C illustrate various examples of formats for packets that may be transmitted and received by the systems described above and the methods described below. The illustrated examples describe possible formats for write, read, and response packets. These examples further illustrate how the format of a packet may change according to the configuration for calculating an error correction value for the transmitted data. For simplicity, the error correction value is illustrated as a checksum. In some aspects, some fields are optional, and are so indicated.

FIG. 11A provides an example of a packet format 400 when the configuration for calculating an error correction value for the transmitted data indicates that no data is to be used to make the calculation. The packet format 400 includes a header 402 and a payload 406, where the payload 406 includes the transmitted data. In some cases, the packet format 400 may also include an error correction value (here illustrated as header checksum 404) for the header data. In some cases the payload 406 may be absent, so that the packet format 400 includes only a header 402 and possibly a header checksum 404. Because the amount of data used to calculate the error correction value for the payload 406 was none, the packet format 400 does not include an error correction value for the payload.

FIG. 11B provides an example of a packet format 410 when the configuration for calculating an error correction value for the transmitted data indicates that all of the data is to be used to make the calculation. The packet format 410 includes a header 402, a payload 406, and a payload checksum 408. The payload 406 includes the transmitted data, and the payload checksum 408 represents the error correction value for the transmitted data. In some cases, the packet format 410 may also include a header checksum 404. In some cases, the payload checksum 408 may be placed before the payload 406.

FIG. 11C provides an example of a packet format 420 when the configuration for calculating an error correction value for the transmitted data indicates that the amount of data to use in the calculation is blocks of a pre-determined size. The packet format 420 includes a header 402 and a payload that has been divided into blocks 406a, 406b of the pre-determined size. Two blocks 406a, 406b are illustrated, and it is understood that the payload may be divided into any number of blocks as given by the size of the payload and the pre-determined size of the blocks. The packet format 420 also includes a number of payload checksums 408a, 408b, one for each payload block 406a, 406b. In the illustrated example, each payload checksum 408a, 408b is placed in the packet format 420 after its respective payload block 406a, 406b. In some cases, the payload checksums 408a, 408b may be placed in other places within the packet format 420. For example, the payload checksums 408a, 408b may be grouped together and placed before or after the payload blocks 406a, 406b. In some cases the packet format 420 may also include a header checksum 404.

Figure 12:
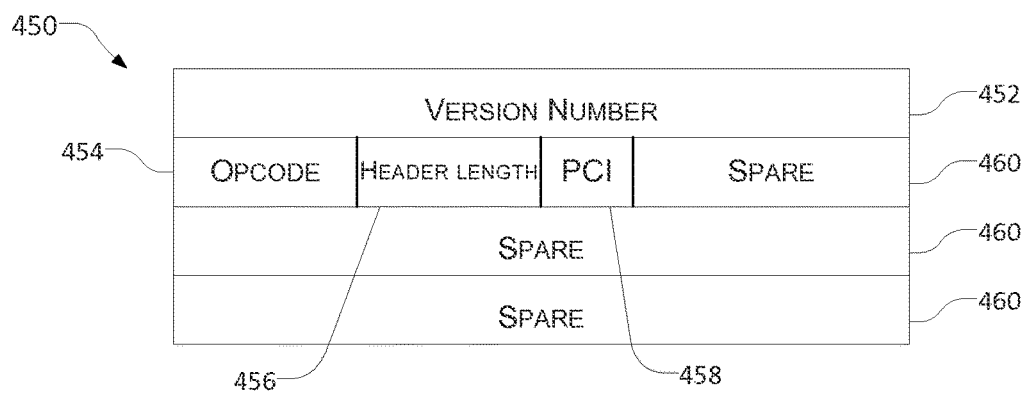
FIG. 12 illustrates an example of a format for a packet header as may be used in any of the packet formats illustrated in FIGS. 11A-11C.

FIG. 12 illustrates an example of a format 450 for a packet header as may be used in any of the packet formats illustrated in FIGS. 11A-11C. A packet header typically provides information about a packet, such as for example a source of the packet, a destination of a packet, information about the contents of the packet, and/or information required by the protocol used to transmit the packet. The format 450 illustrated in FIG. 12 provides one example of a packet header that may include additional information as necessary, and/or can be extended as needed. The format 450 may include a version number 452 field. The version number 452 may indicate one among several various available version of the packet header. The format 452 may also include an operation code, or "opcode" 454 field that indicates the type of operation to be executed by the packet. The format 450 may further include a header length 456 field. The header length 456 may specify the size of the packet header, in either number of bits, number of bytes, number of words (where a word is a certain number of bits long), or number of segments (where a segment is a certain number of bytes, such as a minimum transfer unit (MTU) as used by certain transmission protocols). The format 452 may further include the configuration for calculating the error correction value, here given as the payload checksum interval or PCI 458. The PCI 458 field may be any number of bits as needed to specify the number of different configurations. For example, a PCI 458 value of "0" may be used to indicate that none of the packet payload data is to be used to calculate the error correction value; a value of "1" may be used to indicate that all of the payload data is to be used; and a value of "2" may be used to indicate that blocks of data of a pre-determined size are to be used. These three options can be represented by a two-bit field. The format 452 may further include some number of spare fields 460. The spare fields 460 may be used for additional information. The additional information may be defined in different ways for different uses of the packet header. For example, the spare fields 460 may be defined differently for different version numbers 452. Alternatively or additionally the spare fields 460 may be defined differently for different opcodes 454. The spare fields 460 may also be used to extend the uses of the packet header.

IV. Methods

FIGS. 13-17 illustrate embodiments of methods for calculating, generating, and checking error correction values, to assure the correctness of data transferred by an I/O request. These methods may be implemented by the systems described above.

Figure 13:
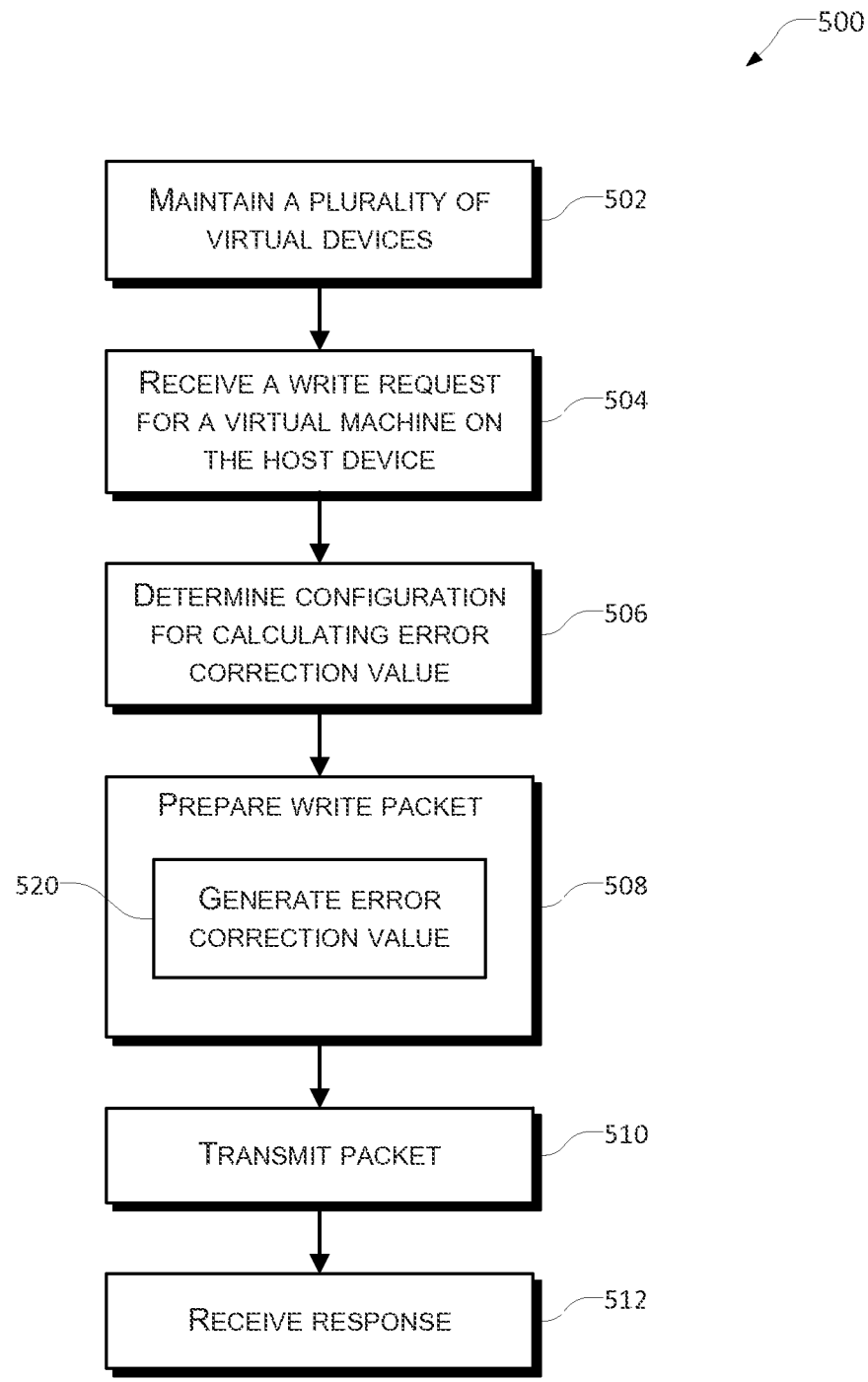
FIG. 13 illustrates one embodiment of a process for processing a write request that includes calculating and generating an error correction value.

FIG. 13 illustrates one embodiment of a process 500 for processing a write request that includes calculating and generating an error correction value. The process can be performed by the I/O adapter device 102 and/or one or more CPUs as illustrated in FIG. 1, or any other suitable combination of hardware, software, and/or firmware.

As illustrated in FIG. 13, at step 502 of the process 500, a plurality of virtual devices are maintained. Virtual devices such as these are described in relation to FIG. 2. As in FIG. 2, in FIG. 13 the virtual devices are operable to receive write requests from a host device and transmit write packets for those write requests to a storage location. The virtual devices will also receive responses to transmitted packets, and send a response virtual device that requested the write.

At step 504 a write request is received from a virtual machine on a host device. The virtual machine can be one such as is illustrated in FIG. 2. The write request is directed to a storage location that is expected to receive the write data. At step 506 of FIG. 13, the process 500 determines a configuration for calculating an error correction value. The error correction value is used by the recipient of the write request to verify that the write data has arrived without errors. At step 506, the configuration may be determined based on various settings. For example, the I/O adapter device may be set to apply the same configuration to all write requests. Alternatively or additionally, the I/O adapter device may be set to apply a configuration to all write requests from a specific virtual machine, and/or all write requests directed to a specific virtual device, and/or all write requests directed to one or more queues. Yet another alternative is for each write request to specify the configuration.

The configuration for calculating the error correction value indicates which portion of the write data should be used to calculate the error correction value. For example, in some cases, the configuration indicates that no data is to be used. In these cases, no error correction value is calculated or sent with the write data. In another example, the configuration indicates that all the data is to be used. In these cases, all of the write data is to be used to calculate the error correction value. In yet another example, the configuration indicates that the error correction value is to be calculated over blocks of data of a pre-determined size. In these cases, the write data is divided into blocks of the pre-determined size, and an error correction value is calculated for each block.

Once a configuration for calculating the error correction value has been determined at step 506, the process 500 proceeds to step 508. In step 508, the process 500 prepares a write packet for transmission to the storage location. The write packet includes a packet header and a packet payload. The packet header includes information for transmitting the write packet, such as for instance network protocol information. The packet payload includes the write data. Preparing the write packet may include steps such as compression, encryption, protocol processing, and stateless operations.

Preparing the write packet also includes a sub-process 520 for generating the error correction value. The sub-process 520 calculates the error correction value according to the configuration determined at step 506. This calculation generates the error correction value, which is then included in the write packet. The sub-process 520 is described in further detail below.

Once the write packet is prepared, the process 500 continues to step 510, and transmits the packet. At step 512, the process 500 receives a response to the write request. The response may indicate that the write request has completed successfully. Alternatively, the response may indicate that the write request did not complete successfully. For example, the target storage location may have computed an error correction value, and found that its computed error correction value was different from the one it received. This may indicate that the target storage location received the write data with errors. An error response may necessitate informing the virtual machine that requested the write, and/or retransmitting the write request.

Figure 14:
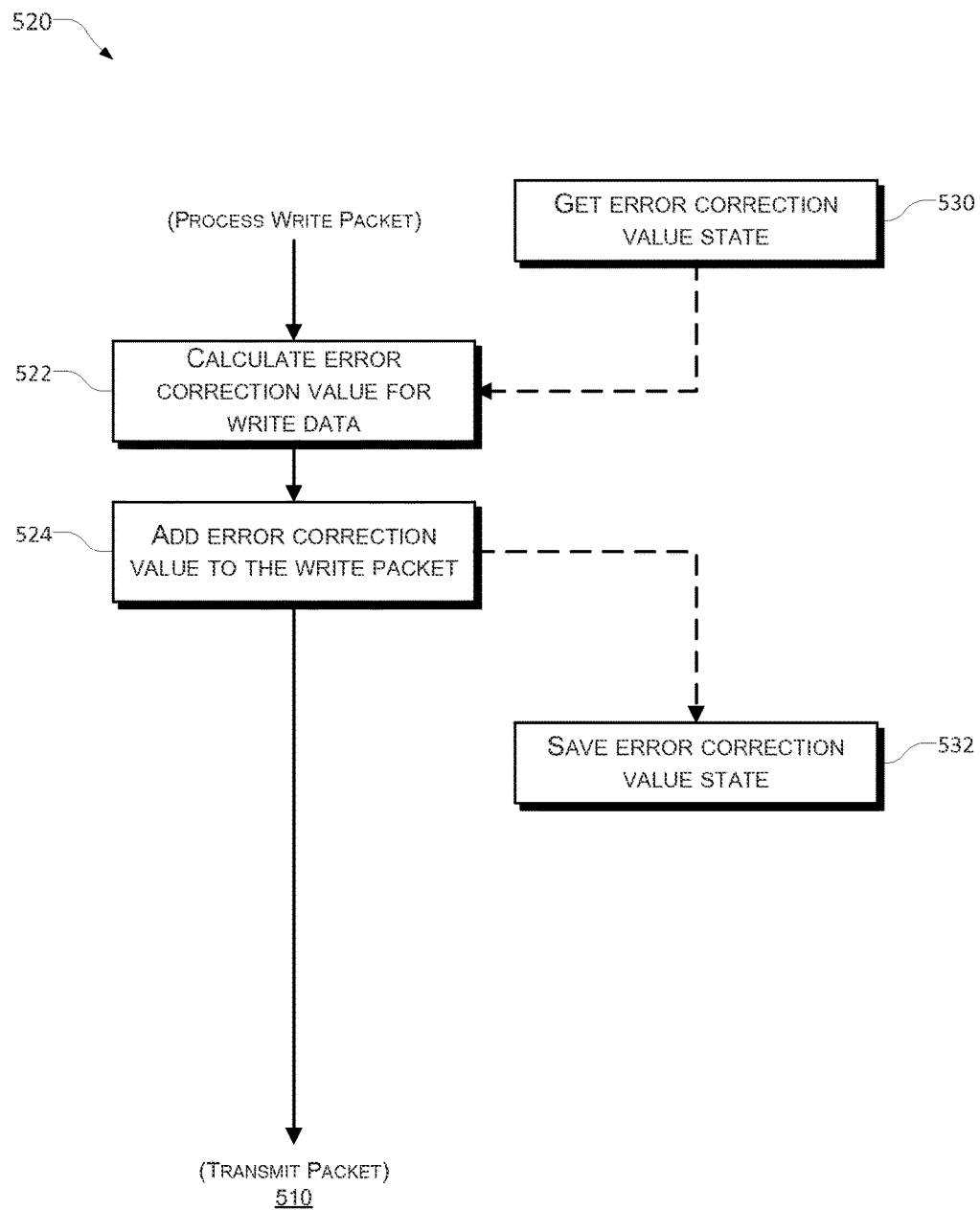
FIG. 14 illustrates an embodiment of the sub-process for preparing packets for transmission when the configuration indicates that all of the write data is to be used to calculate the error correction value.

As noted above, the configuration for calculating the error correction value indicates what portion of the write data is to be used to calculate the value. FIG. 14 illustrates one embodiment of the sub-process 520 when the configuration indicates that all of the write data is to be used to calculate the error correction value. At step 522, the error correction value is calculated over all of the write data. At step 524, the error correction value is added to the write packet. The error correction value may be added to the packet header, or may be placed at the beginning or end of the packet payload. Once the error correction value has been added to the write packet, the sub-process 520 exits to the step 510 for transmitting the write packet.

FIG. 14 also illustrates optional steps that may occur when the error correction value is to be calculated over more than one related write request. Write requests may be related when the write data for these requests form a single set of data. This may mean that the error correction value is calculated over write data from multiple requests. In such cases, an error correction value state may be saved between write requests. At optional step 530, the error correction value state may be retrieved. When the current write request is the first of the related write requests, option step 530 may be skipped, or may be used to indicate that no state has been saved. The error correction value state may be used, at step 522, to calculate the error correction value for the current write data. Before or after the thusly calculated error correction value is added to the write packet at step 524, the error correction value state is updated and saved at optional step 532.

Figure 15:
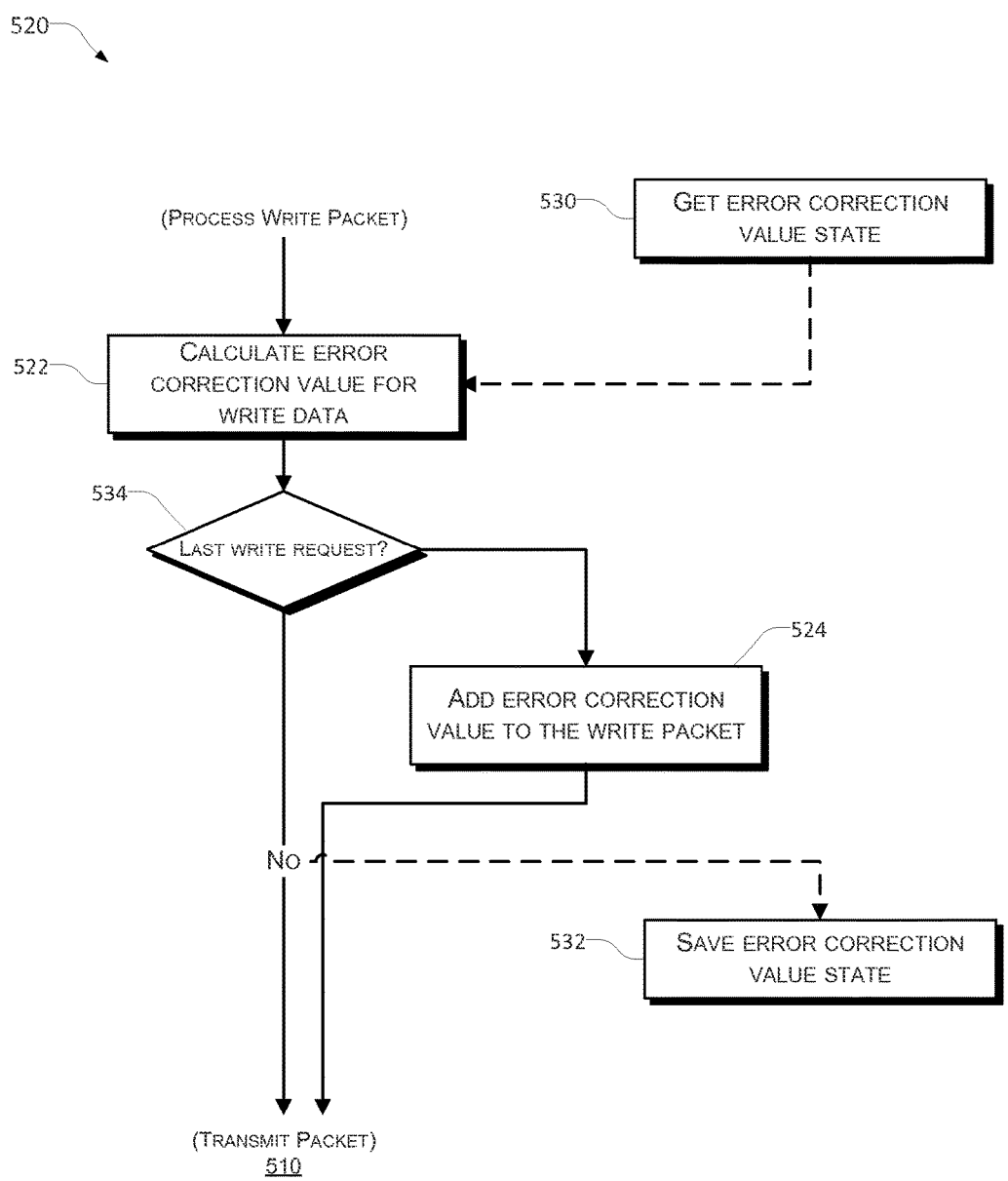
FIG. 15 illustrates another embodiment of the sub-process when the configuration indicates that all of the write data is to be used to calculate the error correction value.

FIG. 15 illustrates another embodiment of the sub-process 520 when the configuration indicates that all of the write data is to be used to calculate the error correction value. In this embodiment, the error correction value is calculated over more than one related write request, and an error correction value state is maintained between the related write requests. At step 530, an error correction value state may be retrieved. When the current write request is the first of the related write requests, this sub-process 520 may be skipped. At step 522, the error correction value for the current write request is calculated for all of the write data. Step 522 may use the error correction value state retrieved at step 530. When the current write request is the first of the related set, the error correction value state may not be needed. At step 534, the sub-process 520 determines whether the current write request is the last in the related set. If not, the write packet for the write request is transmitted. The error correction value state may also be saved, at step 532, for each write request that is not the last write request. If so, the sub-process 520 proceeds to step 524. At step 524 the error correction value, calculated over all the data from all the related write requests, is added to this last write packet. This last write packet is then transmitted.

Figure 16:
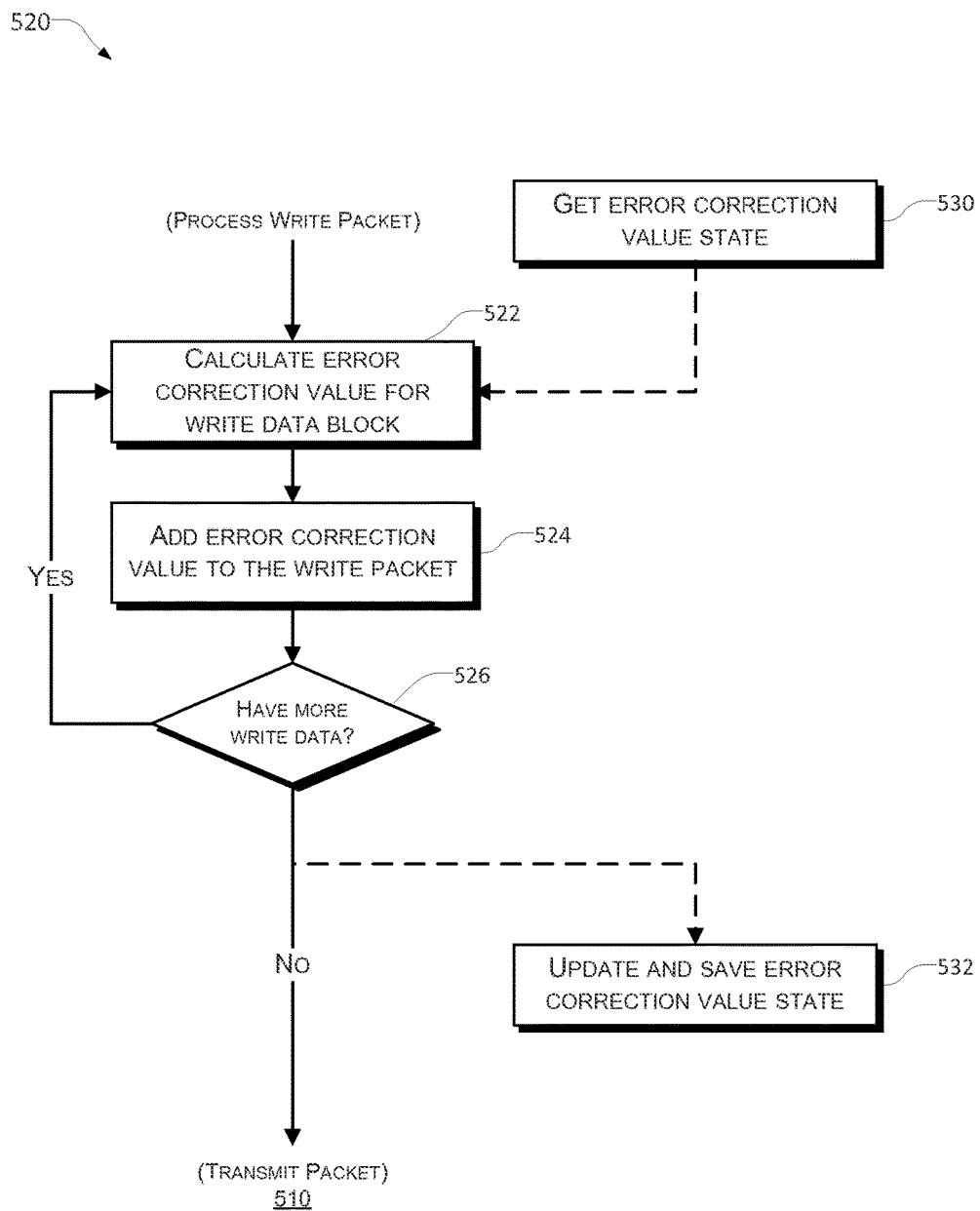
FIG. 16 illustrates another embodiment of the sub-process when the configuration for calculating the error correction value indicates that an error correction value is to be calculated over blocks of a certain size.

FIG. 16 illustrates an embodiment of the sub-process 520 when the configuration for calculating the error correction value indicates that an error correction value is to be calculated over blocks of a certain size. With this configuration the write data may be divided into one or more data blocks of the pre-determined size, and an error correction value is computed for each write data block. At step 522, the sub-process 520 may take the next block of write data and calculate an error correction value. At step 524, this error correction value may be added to the write packet. At step 526, the sub-process 520 checks whether there are more write data blocks to calculate error correction values for. If so, the sub-process 520 returns to step 522. If not, the sub-process 520 exits to the step 510 for transmitting the write packet.

FIG. 16 also illustrates optional steps that may occur when the error correction value is to be calculated over more than one related write request. At optional step 530, the error correction value state may be retrieved. The error correction value state is used, at step 522, to calculate the error correction value for the first write data block from the write data. The completion of step 522 results in a new error correction value state. This new error correction value state may be used for calculating the error correction value for subsequent write data blocks. Once an error correction value has been computed for all of the write data blocks, the most recent error correction value state may be saved at optional step 532.

Figure 17:
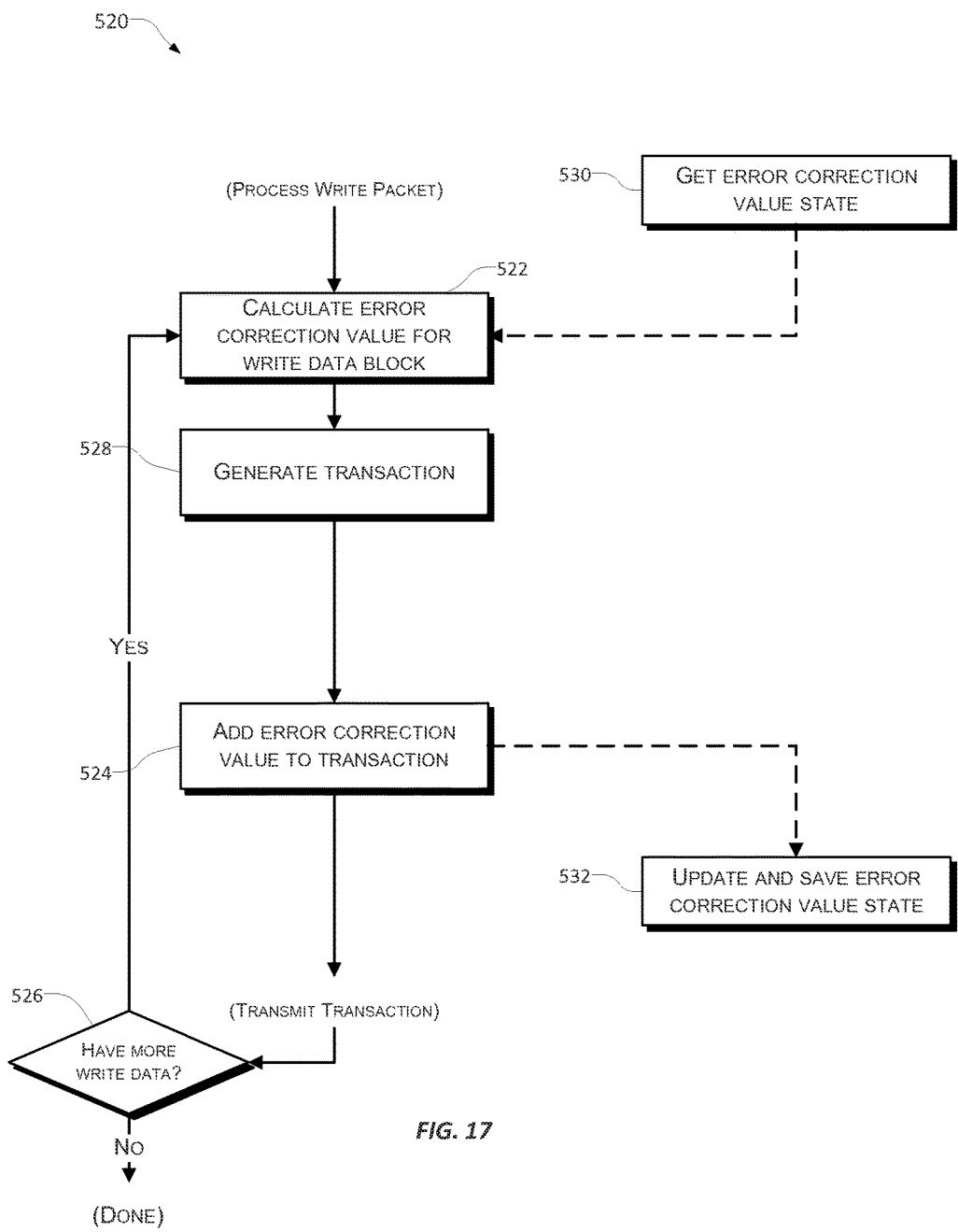
FIG. 17 illustrates another embodiment of the sub-process when the configuration for calculating the error correction value indicates that an error correction value is to be calculated over blocks of a certain size.

FIG. 17 illustrates another embodiment of the sub-process 520 when the configuration for calculating the error correction value indicates that an error correction value is to be calculated over blocks of a certain size. In this example embodiment, the write data may be divided into one or more data blocks of the pre-determined size, and a separate write transaction may be generated and transmitted for each write data block. At step 522, the sub-process 520 may take the next block of write data and calculate an error correction value. At step 528, the sub-process 520 may generate a write transaction, where the write transaction includes the write data block. At step 524 the error correction value may be added to the write transaction. The sub-process 520 may then be exited to transmit the write transaction. The sub-process 520 may be re-entered, at step 526, to determine where there are more write data blocks. If so, the sub-process 520 returns to step 522. If not, the sub-process 520 is done.

FIG. 17 also illustrates optional steps that may occur when the error correction value is calculated over more than one related write request. At optional step 530, an error correction value state may be retrieved. The error correction value state may be used at step 522 to calculate the error correction value for a write data block. Typically, the error correction value state is used for the first write data block for the first write request of the related set. From step 528, the sub-process 520 may optionally determine whether the write transaction generated at step 528 is the last write transaction. The last write transaction may be the last of the current write request, or the last write transaction of the last write request of the related set. When the write transaction is not the last (under either criteria), the sub-process 520 may exit to transmit the write transaction. When the write transaction is the last (under either criteria), the sub-process 520 proceeds to step 524 to add the error correction value to the write transaction. The write transaction is then transmitted. Optionally, at step 532 the error correction value may be updated and saved. This step 532 may be executed after the error correction value has been added to the last write transaction.

Figure 18:
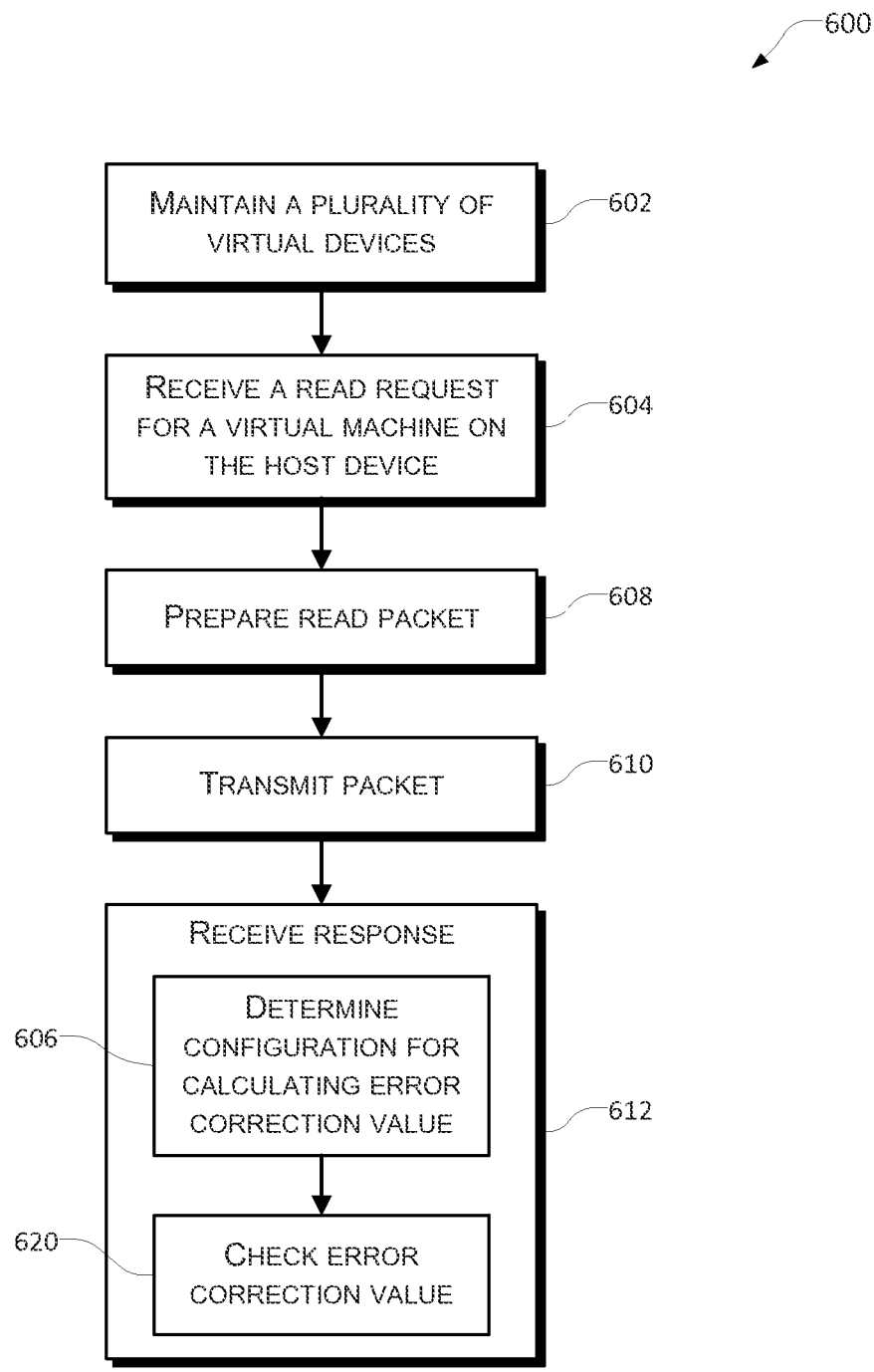
FIG. 18 illustrates one embodiment of a process for processing a read request that includes calculating and checking an error correction value.

FIG. 18 illustrates one embodiment of a process 600 for processing a read request that includes calculating and checking an error correction value. At step 602 of the process 600 a plurality of virtual devices are maintained. Virtual devices such as these are described in relation to FIG. 2. As in FIG. 2, in FIG. 18 the virtual devices are operable to receive read requests from a host device and transmit read packets for those read requests to a storage location. The virtual devices will also receive responses to transmitted packets, where the responses include the read data.

At step 604 a read request is received from a virtual machine on a host device. The virtual machine can be one such as is illustrated in FIG. 2. The read request is directed to a storage location that is expected to have the requested data. At step 608 of FIG. 18, the process 600 prepares a read packet for the read request. The read packet includes a packet header and a packet payload. The packet header includes information for transmitting the write packet, such as for instance network protocol information. The packet payload may be empty, or may contain information to send to the target storage location. Preparing the read packet may include, for example, protocol processing and stateless operations.

Once the read packet is prepared, the process 600 continues to step 610, and transmits the read packet. At step 612, the process 600 receives a response packet. The response may indicate that the read request has completed successfully. Alternatively, the response may indicate that the read request did not complete successfully. An error response may necessitate informing the virtual machine that requested the read, and/or retransmitting the read request. A read response packet typically includes a packet header and a packet payload. For read responses that indicate that the read request completed successfully, the payload includes the requested read data.

Receiving the read response also includes step 606, at which the process 600 determines a configuration for calculating an error correction value. The error correction value is used by the I/O adapter to verify that the read data has arrived without errors. The configuration may be determined by examining the response packet, for example by looking at the response packet header.

The configuration for calculating the error correction value indicates which portion of the read data should be used to calculate the error correction value. For example, in some cases, the configuration indicates that no data is to be used. In these cases, no error correction value is calculated and the read data is not checked for correctness. In another example, the configuration indicates that all the data is to be used. In these cases, all of the read data is to be used to calculate the error correction value. In yet another example, the configuration indicates that the error correction value is to be calculated over blocks of data of a pre-determined size. In these cases, the read data is divided into blocks of the pre-determined size, and an error correction value is calculated for each block.

Once the process 600 has determined the configuration, the process continues to a sub-process 620 for checking the error correction value. Checking the error correction value allows the process 600 to verify that the read data was received without errors. The sub-process 620 is described in further detail below.

Figure 19:
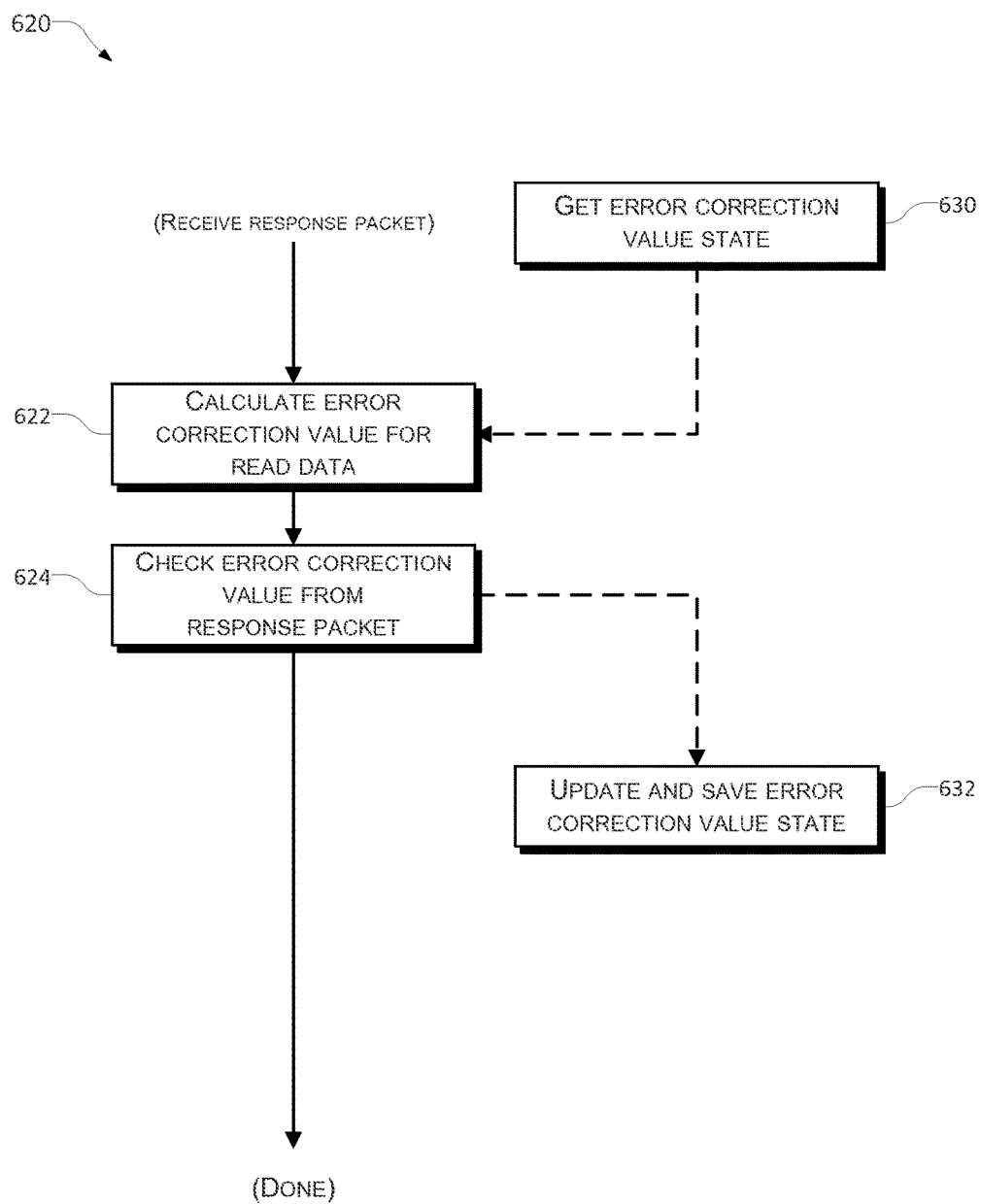
FIG. 19 illustrates an embodiment of the sub-process for preparing packets for transmission when the configuration indicates that all of the read data is to be used to calculate the error correction value.

As noted above, the configuration for calculating the error correction value indicates what portion of the read data is to be used to calculate the value. FIG. 19 illustrates an embodiment of the sub-process 620 when the configuration indicates that all of the read data is to be used to calculate the error correction value. At step 622, the error correction value is calculated over all of the read data. At step 624, the calculated error correction value is checked against the error correction value received with the read data. Once the calculated error correction value is checked against the received error correction value, the sub-process 620 exits and the process 600 is essentially done, though in some cases the process 600 may engage in other activities. For example, when the calculated and received error correction values do not match, steps may need to be taken, such as informing the virtual machine that requested the read and/or retransmitted the read request.

FIG. 19 also illustrates optional steps that may occur when the error correction value is to be calculated over more than one related read request. Read requests may be related when the read data for these requests form a single set of data. This may mean that the error correction value is calculated over read data from multiple requests. In such cases, an error correction value state may be saved between read requests. At optional step 630, the error correction value state may be retrieved. When the current read request is the first of the related read requests, option step 630 may skipped, or may be used to indicate that no state has been saved. The error correction value state is used, at step 622, to calculate the error correction value for the current read data. Before or after the thusly calculated error correction value is checked against the received error correction value at step 624, the error correction value state is updated and saved at optional step 632.

Figure 20:
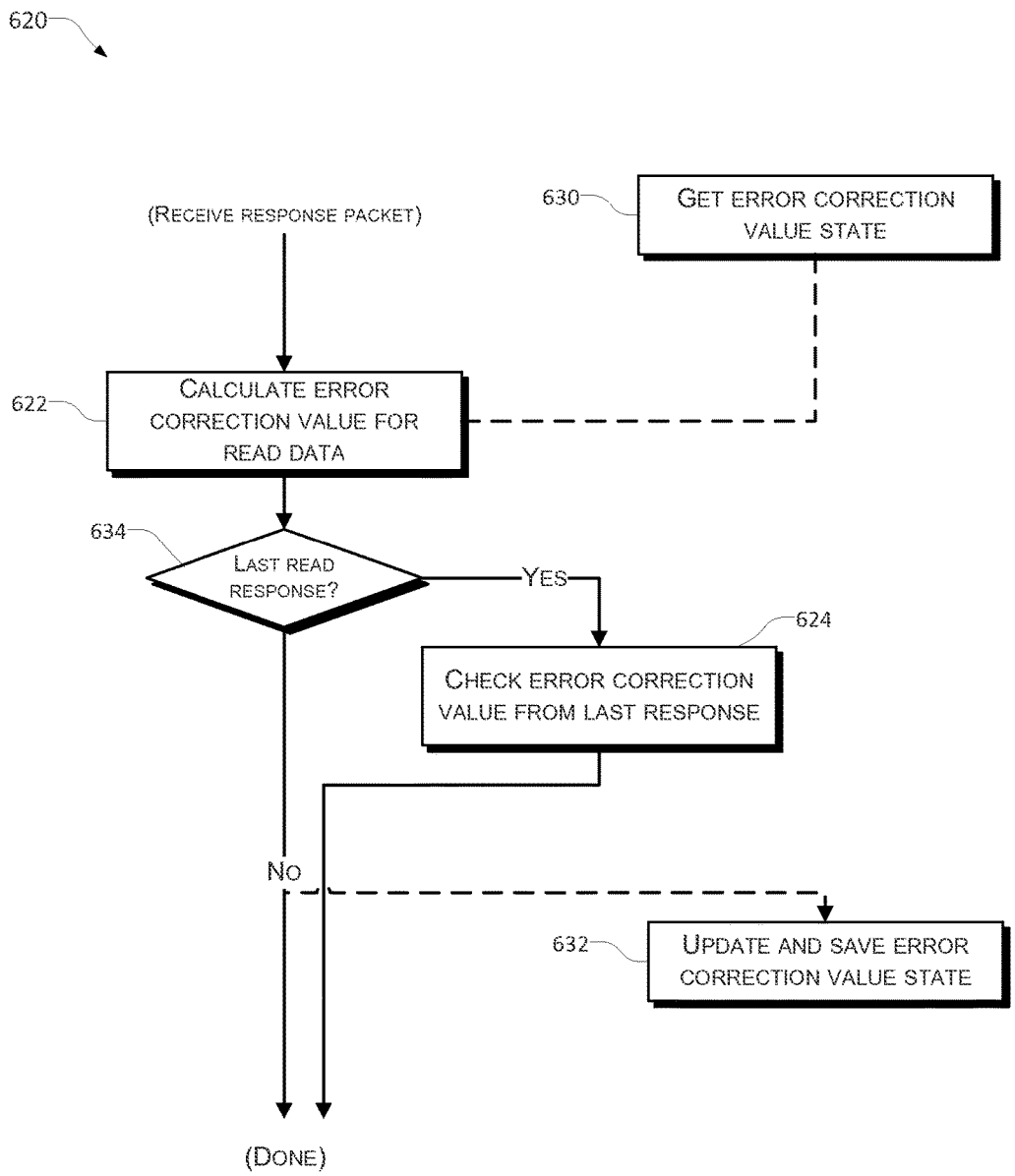
FIG. 20 illustrates another embodiment of the sub-process when the configuration indicates that all of the read data is to be used to calculate the error correction value.

FIG. 20 illustrates another embodiment of the sub-process 620 when the configuration indicates that all of the read data is to be used to calculate the error correction value. In this embodiment, the read request may be one of multiple related read requests. In such a case, an error correction value state may be maintained between the related read requests and their associated response packets. At step 630, an error correction value state may be retrieved. At step 622, the error correction value the read data received with the current read response packet is calculated for all of the read data from the current read response packet. Step 622 may use the error correction value state retrieved at step 630. When the current read response is the first of the related set, the error correction value state may not be needed. At step 634, the sub-process 620 determines whether the current read response is the last of the related set. If not, the sub-process 620 is done for the current read response packet. The sub-process 620 may at this point update and save the current error correction value state, at step 632. When the current read response is the last of related set, the sub-process 620 proceeds to step 624. At step 624, the final error correction value is checked against an error correction value received with the last read response packet. After step 624, the sub-process 620 is done.

Figure 21:
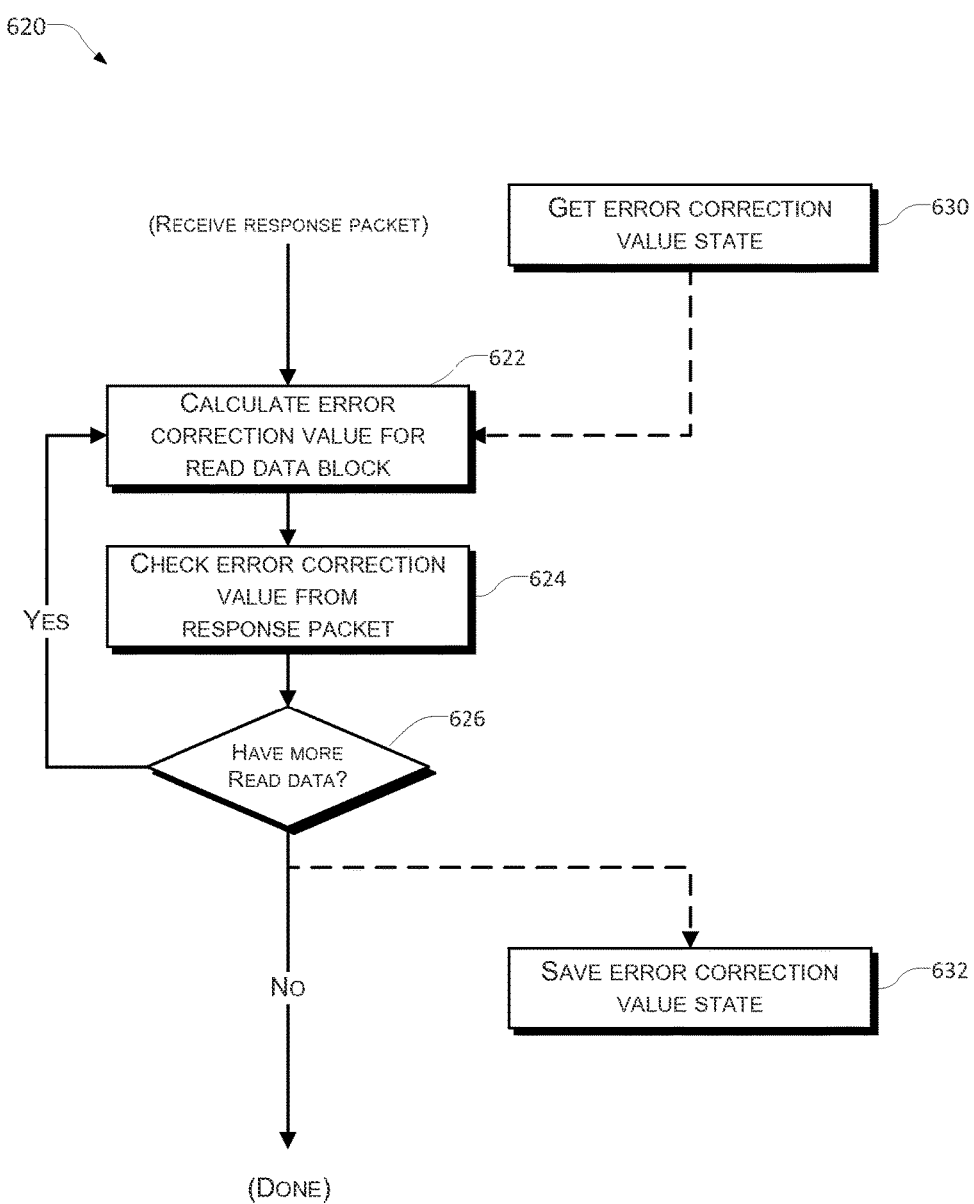
FIG. 21 illustrates an embodiment of the sub-process when the configuration for calculating the error correction value indicates that an error correction value is to be calculated over blocks of a certain size.

FIG. 21 illustrates an embodiment of the sub-process 620 when the configuration for calculating the error correction value indicates that an error correction value is to be calculated over blocks of a certain size. With this configuration the read data is divided into blocks of the pre-determined size, and the read response packet will include an error correction value for each read data block. The sub-process 620 checks each of the received error correction values. At step 622, the sub-process 620 may take a block of read data and calculate the error correction value for this block. At step 624, this calculated error correction value may be checked against the error correction value received for the same block of read data. At step 626, the sub-process 620 checks if there are more read data blocks to calculate error correction values for. If so, the sub-process 620 returns to step 622 and repeats steps 622 and 624 for the next read data block. If not, the sub-process 620 is essentially done, though in some cases the process 600 may engage in other activities.

FIG. 21 also illustrates optional steps that may occur when the error correction value is to be calculated over more than one related read request. At optional step 630, the error correction value state may be retrieved. The error correction value state is used, at step 632, to calculate the error correction value for the first read data block from the read data. The completion of step 622 results in a new error correction value state. This new error correction value state may be used for calculating the error correction value for subsequent read data blocks. Once an error correction value has been computed for all the read data blocks, the most recent error correction value state may be saved at optional step 632.

Figure 22:
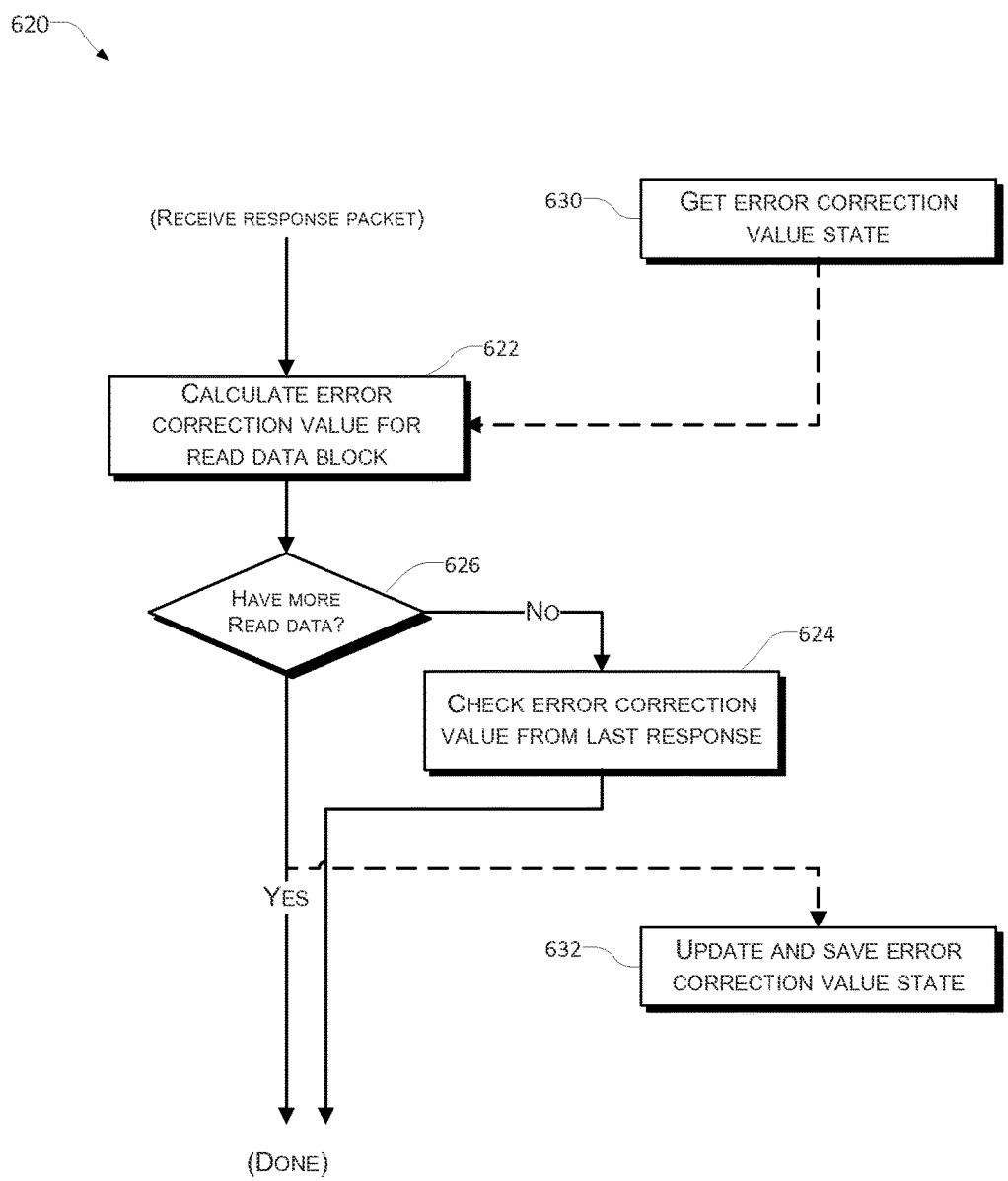
FIG. 22 illustrates another embodiment of the sub-process when the configuration for calculating the error correction value indicates that an error correction value is to be calculated over blocks of a certain size.

FIG. 22 illustrates another embodiment of the sub-process 620 when the configuration for calculating the error correction value indicates that an error correction value is to be calculated over blocks of a certain size. In this embodiment, the read request may receive one or more read response packets, each including a block of read data of the pre-determined size. In such a case, an error correction value state may be maintained between the series of read response packets. At step 630, an error correction value state may be retrieved. At step 622, the error correction value for the read data block received with the current read response packet is calculated. Step 622 may use the error correction value state retrieved at step 630. When the current read response packet is the first of the series of expected read response packets, the error correction value state may not be needed. At step 626, the sub-process 620 determines whether it has received all the read data blocks for the data requested by the read. When more read data blocks are expected, the sub-process 620 is done until the next response packet is received. The sub-process 620 may at this point update and save the current error correction value state, at step 632. When no more read data blocks are expected, the sub-process 620 proceeds to step 624. At step 624, the final error correction value is checked against an error correction value received with the last read response packet. After step 624, the sub-process 620 is done.

V. Computer Systems

Figure 23:
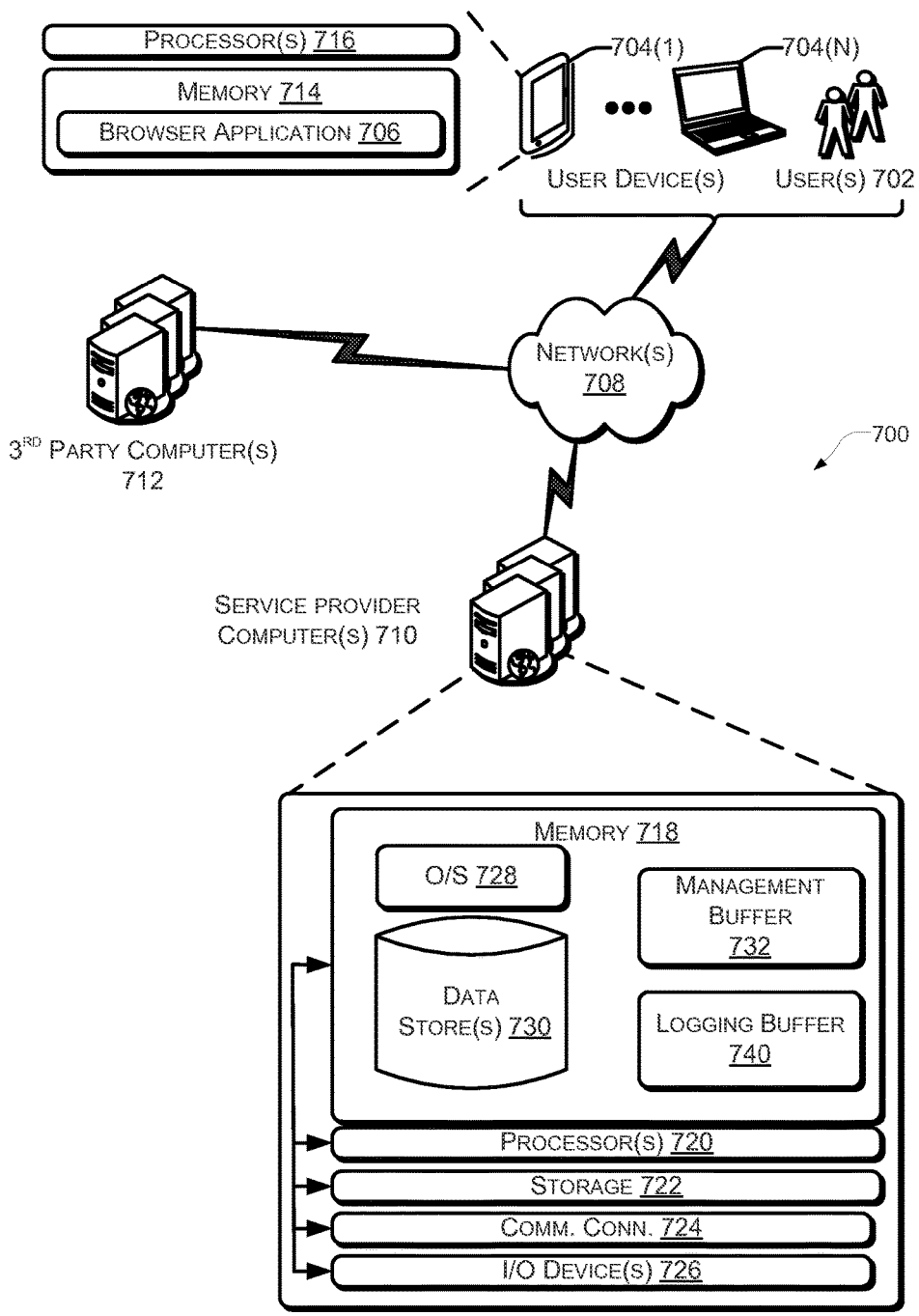
FIG. 23 illustrates an exemplary architecture for features and systems described herein that includes one or more service provider computers and/or a user device connected via one or more networks, according to at least one exemplary embodiment.

FIG. 23 illustrates an exemplary architecture for features and systems described herein that includes one or more service provider computers and/or a user device connected via one or more networks, according to at least one exemplary embodiment. The devices discussed in FIGS. 1-14, may use one or more components of the computing devices described in FIG. 23 or may represent one or more computing devices described in FIG. 23. In the illustrated architecture 700, one or more users 702 may use user computing devices 704(1)-(N) to access an application 706 (e.g., a web browser or mobile device application), via one or more networks 708. In some aspects, the application 706 may be hosted, managed and/or provided by a computing resources service or service provider. One or more service provider computers 710 may provide a native application which is configured to run on the user devices 704 which user(s) 702 may interact with. The service provider computer(s) 710 may, in some examples, provide computing resources such as, but not limited to, client entities, low latency data storage, durable data storage, data access, management, virtualization, cloud-based software solutions, electronic content performance management, etc. The service provider computer(s) 710 may also be operable to provide web hosting, computer application development and/or implementation platforms, combinations of the foregoing or the like to the user(s) 702. The service provider computer(s) 710, in some examples, may communicate with one or more third party computers 712.

In some examples, network(s) 708 may include any one or a combination of many different types of networks, such as cable networks, the Internet, wireless networks, cellular networks and other private and/or public networks. While the illustrated example represents the user(s) 702 accessing an application 706 over the network(s) 708, the described techniques may equally apply in instances where the user(s) 702 interact with the service provider computer(s) 710 via user device(s) 704 over a landline phone, via a kiosk or in any other manner. It is also noted that the described techniques may apply in other client/server arrangements (e.g., set-top boxes, etc.), as well as in non-client/server arrangements (e.g., locally stored applications, etc.).

As described briefly above, the application 706 may allow the user(s) 702 to interact with the service provider computer(s) 710 such as to access web content (e.g., web pages, music, video, etc.). The service provider computer(s) 710, which may be arranged in a cluster of servers or as a server farm, may host the application 706 and/or cloud-based software services. Other server architectures may also be used to host the application 706. The application 706 may be capable of handling requests from many users 702 and serving, in response, various item web pages. The application 706 can provide any type of website that supports user interaction, including social networking sites, online retailers, informational sites, blog sites, search engine sites, news and entertainment sites and so forth. As discussed above, the described techniques can similarly be implemented outside of the application 706, such as with other applications running on the user device(s) 704.

The user device(s) 704 may be any type of computing device such as, but not limited to, a mobile phone, a smart phone, a personal digital assistant (PDA), a laptop computer, a desktop computer, a thin-client device, a tablet PC, an electronic book (e-book) reader, etc. In some examples, the user device(s) 704 may be in communication with the service provider computer(s) 710 via the network(s) 708, or via other network connections. Additionally, the user device(s) 704 may be part of the distributed system managed by, controlled by or otherwise part of the service provider computer(s) 710 (e.g., a console device integrated with the service provider computers 710).

In one illustrative configuration, a user device(s) 704 may include at least one memory 714 and one or more processing units (or processor(s) 716). The processor(s) 716 may be implemented as appropriate in hardware, computer-executable instructions, firmware, or combinations thereof. Computer-executable instruction or firmware implementations of the processor(s) 716 may include computer-executable or machine-executable instructions written in any suitable programming language to perform the various functions described. The user device(s) 704 may also include geo-location devices (e.g., a global positioning system (GPS) device or the like) for providing and/or recording geographic location information associated with the user device(s) 704.

The memory 716 may store program instructions that are loadable and executable on the processor(s) 716, as well as data generated during the execution of these programs. Depending on the configuration and type of the user device(s) 704, the memory 714 may be volatile (such as random access memory (RAM)) and/or non-volatile (such as read-only memory (ROM), flash memory, etc.). The user device(s) 704 may also include additional removable storage and/or non-removable storage including, but not limited to, magnetic storage, optical disks and/or tape storage. The disk drives and their associated computer-readable media may provide non-volatile storage of computer-readable instructions, data structures, program modules and other data for the computing devices. In some implementations, the memory 714 may include multiple different types of memory, such as static random access memory (SRAM), dynamic random access memory (DRAM), or ROM.

Turning to the contents of the memory 714 in more detail, the memory 714 may include an operating system and one or more application programs or services for implementing the features disclosed herein including at least a user provided input element or electronic service web page, such as via a browser application 706 or dedicated applications (e.g., smart phone applications, tablet applications, etc.). The browser application 706 may be configured to receive, store and/or display a website or other interface for interacting with the service provider computer(s) 710. Additionally, the memory 714 may store access credentials and/or other user information such as, but not limited to, user IDs, passwords and/or other user information. In some examples, the user information may include information for authenticating an account access request such as, but not limited to, a device ID, a cookie, an IP address, a location or the like. In addition, the user information may include a user-provided response to a security question or a geographic location obtained by the user device 704.

In some aspects, the service provider computer(s) 710 may also be any type of computing devices such as, but not limited to, a mobile phone, a smart phone, a personal digital assistant (PDA), a laptop computer, a desktop computer, a server computer, a thin-client device, a tablet PC, etc. Additionally, it should be noted that in some embodiments, the service provider computer(s) 710 are executed by one or more virtual machines implemented in a hosted computing environment. The hosted computing environment may include one or more rapidly provisioned and released computing resources, which computing resources may include computing, networking and/or storage devices. A hosted computing environment may also be referred to as a cloud computing environment. In some examples, the service provider computer(s) 710 may be in communication with the user device(s) 704 and/or other service providers via the network(s) 708, or via other network connections. The service provider computer(s) 710 may include one or more servers, perhaps arranged in a cluster, as a server farm, or as individual servers not associated with one another. These servers may be configured to implement the keyword classification and rating feature services described herein as part of an integrated, distributed computing environment.

In one illustrative configuration, the service provider computer(s) 710 may include at least one memory 718 and one or more processing units (or processor(s) 720). The processor(s) 720 may be implemented as appropriate in hardware, computer-executable instructions, firmware or combinations thereof. Computer-executable instruction or firmware implementations of the processor(s) 720 may include computer-executable or machine-executable instructions written in any suitable programming language to perform the various functions described.

In some instances, the hardware processor(s) 720 may be a single core processor or a multi-core processor. A multi-core processor may include multiple processing units within the same processor. In some embodiments, the multi-core processors may share certain resources, such as busses and second or third level of cache between multiple-cores. In some instances, each core in a single or multi-core processor may also include multiple executing logical processors (or threads). In such a core (that supports multiple logical processors), several stages of the execution pipeline and also lower level caches may also be shared.

The memory 718 may store program instructions that are loadable and executable on the processor(s) 720, as well as data generated during the execution of these programs. Depending on the configuration and type of the service provider computer(s) 710, the memory 718 may be volatile (such as RAM) and/or non-volatile (such as ROM, flash memory, etc.). The service provider computer(s) 710 or servers may also include additional storage 722, which may include removable storage and/or non-removable storage. The additional storage 722 may include, but is not limited to, magnetic storage, optical disks and/or tape storage. The disk drives and their associated computer-readable media may provide non-volatile storage of computer-readable instructions, data structures, program modules and other data for the computing devices. In some implementations, the memory 718 may include multiple different types of memory, such as SRAM, DRAM, or ROM.

The memory 718, the additional storage 722, both removable and non-removable are all examples of computer-readable storage media. For example, computer-readable storage media may include volatile or non-volatile, removable or non-removable media implemented in any method or technology for storage of information such as computer-readable instructions, data structures, program modules or other data. The memory 718 and the additional storage 722 are all examples of computer storage media. Additional types of computer storage media that may be present in the service provider computer(s) 710 may include, but are not limited to, PRAM, SRAM, DRAM, RAM, ROM, EEPROM, flash memory or other memory technology, CD-ROM, DVD or other optical storage, magnetic cassettes, magnetic tape, magnetic disk storage or other magnetic storage devices, or any other medium which can be used to store the desired information and which can be accessed by the service provider computer(s) 710. Combinations of any of the above should also be included within the scope of computer-readable media.

Alternatively, computer-readable communication media may include computer-readable instructions, program modules or other data transmitted within a data signal, such as a carrier wave or other transmission. However, as used herein, computer-readable storage media does not include computer-readable communication media.

The service provider computer(s) 710 may also contain communications connection(s) 724 that allow the service provider computer(s) 710 to communicate with a stored database, another computing device or server, user terminals and/or other devices on the network(s) 708. The service provider computer(s) 710 may also include I/O device(s) 726, such as a keyboard, a mouse, a pen, a voice input device, a touch input device, a display, speakers, a printer and the like.

The memory 718 may include an operating system 728, one or more data stores 730 and/or one or more application programs or services for implementing the features disclosed herein, including a management buffer 732 and a logging buffer 740. The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 23, and/or functions described herein can be provided by one or more modules that exist as separate modules and/or module functions described herein can be spread over multiple modules.

Figure 24:
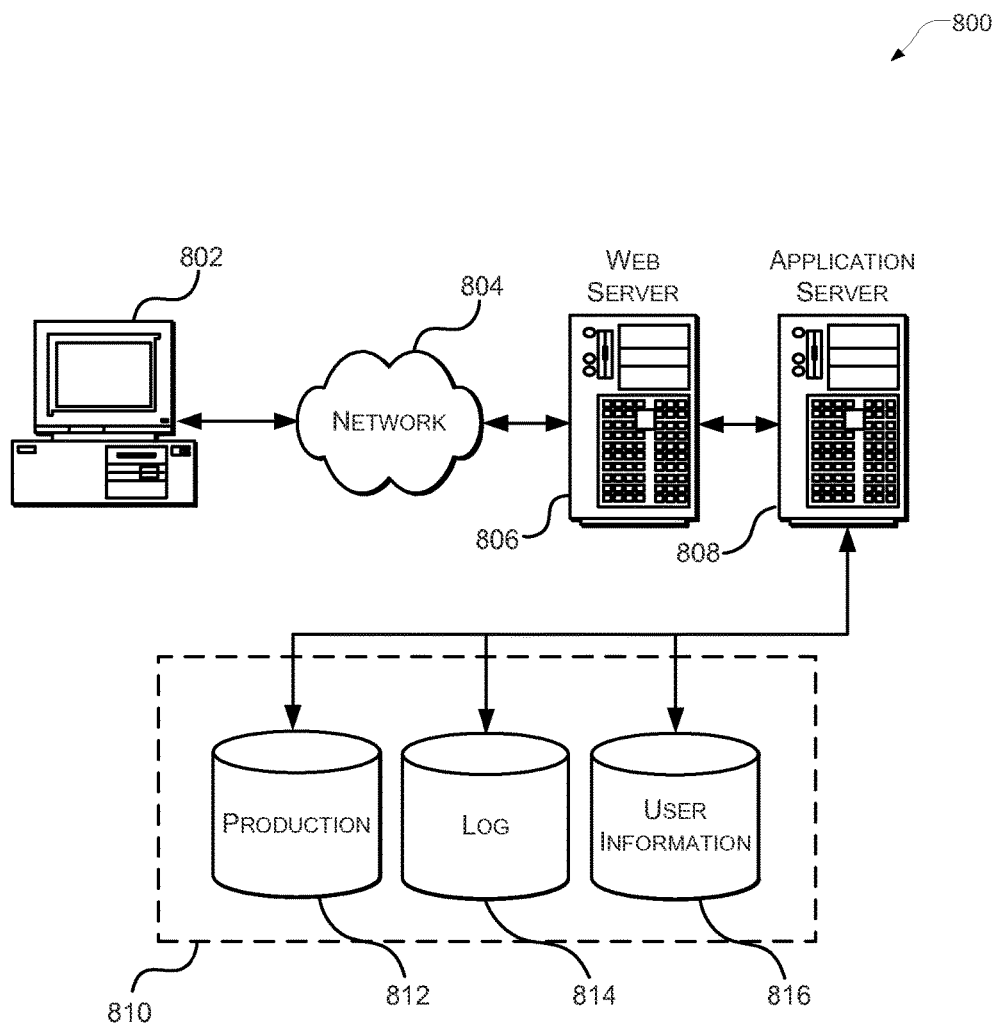
FIG. 24 illustrates aspects of an example environment for implementing aspects in accordance with various embodiments.

FIG. 24 illustrates aspects of an example environment 800 for implementing aspects in accordance with various embodiments. As will be appreciated, although a Web-based environment is used for purposes of explanation, different environments may be used, as appropriate, to implement various embodiments. The environment includes an electronic client device 802, which can include any appropriate device operable to send and receive requests, messages or information over an appropriate network 804 and convey information back to a user of the device. Examples of such client devices include personal computers, cell phones, handheld messaging devices, laptop computers, set-top boxes, personal data assistants, electronic book readers and the like. The network can include any appropriate network, including an intranet, the Internet, a cellular network, a local area network or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 806 for receiving requests and serving content in response thereto, although for other networks an alternative device serving a similar purpose could be used as would be apparent to one of ordinary skill in the art.

The illustrative environment includes at least one application server 808 and a data store 810. It should be understood that there can be several application servers, layers, or other elements, processes or components, which may be chained or otherwise configured, which can interact to perform tasks such as obtaining data from an appropriate data store. As used herein the term "data store" refers to any device or combination of devices capable of storing, accessing and retrieving data, which may include any combination and number of data servers, databases, data storage devices and data storage media, in any standard, distributed or clustered environment. The application server can include any appropriate hardware and software for integrating with the data store as needed to execute aspects of one or more applications for the client device, handling a majority of the data access and business logic for an application. The application server provides access control services in cooperation with the data store and is able to generate content such as text, graphics, audio and/or video to be transferred to the user, which may be served to the user by the Web server in the form of HyperText Markup Language ("HTML"), Extensible Markup Language ("XML") or another appropriate structured language in this example. The handling of all requests and responses, as well as the delivery of content between the client device 802 and the application server 808, can be handled by the Web server. It should be understood that the Web and application servers are not required and are merely example components, as structured code discussed herein can be executed on any appropriate device or host machine as discussed elsewhere herein.

The data store 810 can include several separate data tables, databases or other data storage mechanisms and media for storing data relating to a particular aspect. For example, the data store illustrated includes mechanisms for storing production data 812 and user information 816, which can be used to serve content for the production side. The data store also is shown to include a mechanism for storing log data 814, which can be used for reporting, analysis or other such purposes. It should be understood that there can be many other aspects that may need to be stored in the data store, such as for page image information and to access right information, which can be stored in any of the above listed mechanisms as appropriate or in additional mechanisms in the data store 810. The data store 810 is operable, through logic associated therewith, to receive instructions from the application server 808 and obtain, update or otherwise process data in response thereto. In one example, a user might submit a search request for a certain type of item. In this case, the data store might access the user information to verify the identity of the user and can access the catalog detail information to obtain information about items of that type. The information then can be returned to the user, such as in a results listing on a Web page that the user is able to view via a browser on the user device 802. Information for a particular item of interest can be viewed in a dedicated page or window of the browser.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 24. Thus, the depiction of the system 800 in FIG. 24 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS") and AppleTalk. The network can be, for example, a local area network, a wide-area network, a virtual private network, the Internet, an intranet, an extranet, a public switched telephone network, an infrared network, a wireless network and any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, Java servers and business application servers. The server(s) also may be capable of executing programs or scripts in response requests from user devices, such as by executing one or more Web applications that may be implemented as one or more scripts or programs written in any programming language, such as Java®, C, C# or C++, or any scripting language, such as Perl, Python or TCL, as well as combinations thereof. The server(s) may also include database servers, including without limitation those commercially available from Oracle®, Microsoft®, Sybase® and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen or keypad) and at least one output device (e.g., a display device, printer or speaker). Such a system may also include one or more storage devices, such as disk drives, optical storage devices and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.) and working memory as described above. The computer-readable storage media reader can be connected with, or configured to receive, a computer-readable storage medium, representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules or other data, including RAM, ROM, Electrically Erasable Programmable Read-Only Memory ("EEPROM"), flash memory or other memory technology, Compact Disc Read-Only Memory ("CD-ROM"), digital versatile disk (DVD) or other optical storage, magnetic cassettes, magnetic tape, magnetic disk storage or other magnetic storage devices or any other medium which can be used to store the desired information and which can be accessed by the a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An Input/Output (I/O) adapter device comprising:
    a first integrated circuit device including one or more processing cores, wherein each processing core is configured to execute a respective plurality of computer-executable instructions, and wherein at least one of the processing cores is configured to emulate one or more virtual devices; and
    a second integrated circuit device including a pipeline;
    wherein the plurality of computer-executable instructions include instructions that, when executed by a processing core from the one or more processing cores, cause the processing core to perform operations including:
        receiving a write request from a virtual machine executing on a host device coupled to the I/O adapter device, wherein the write request includes write data;

determining a configuration for calculating one or more error correction values, wherein the configuration is determined based on the virtual machine that issued the write request, a queue on the I/O adapter device for receiving the write request, or a virtual device from the one or more virtual devices, wherein the configuration specifies a pre-determined data block size, wherein the pre-determined data block size identifies an amount of data over which to calculate an error correction value, wherein, when an error is introduced into the write data during transmission of the write data, the error is detectable using the error correction value;

and wherein the pipeline is configured to:

determine the one or more error correction values, wherein at least one error correction value from the one or more error correction values is determined using the write data, and wherein data used to determine each of the one or more error correction values is less than or equal in size to the pre-determined data block size;

generate a write packet for the write request, wherein the write packet includes a packet header and a packet payload, wherein the packet header includes the configuration for calculating the one or more error correction values, and wherein the packet payload includes at least a portion of the write data;

determine whether to include the one or more error correction values in the write packet, wherein an error correction value from the one or more error correction values is included in the write packet when a last part of the data over which the error correction value was calculated is included with the packet payload; and transmit the write packet.

2. The I/O adapter device of claim 1, wherein the pre-determined data block size is less than, equal to, or greater than a size of the write data.

3. An Input/Output (I/O) adapter device comprising:

a first integrated circuit device including a processor comprising one or more processing cores, wherein each processing core is configured to execute a respective plurality of computer-executable instructions, wherein the plurality of computer-executable instructions cause the processor to:

receive a write request from a virtual machine executing on a host device coupled to the I/O adapter device, wherein the write request includes write data;

determine a configuration for calculating one or more error correction values, wherein the configuration is determined based on the virtual machine that issued the write request or a queue on the I/O adapter device for receiving the write request, wherein the configuration specifies a pre-determined data block size, wherein the pre-determined data block size identifies an amount of data over which to calculate an error correction value, and wherein, when an error is introduced into the write data during transmission of the write data, the error is detectable using the error correction value; and a second integrated circuit device including a circuit configured to:

determine the one or more error correction values, wherein at least one error correction value from the one or more error correction values is determined using the write data, and wherein a portion of the write data used to determine the at least one error correction value is less than or equal in size to the pre-determined data block size;

generate a write packet for the write request, wherein the write packet includes a packet header and a packet payload, wherein the packet header includes the configuration for calculating the one or more error correction values, and wherein the packet payload includes at least a portion of the write data;

determine whether to include the one or more error correction values in the write packet, wherein an error correction value from the one or more error correction values is included in the write packet when a last part of data over which the error correction value was calculated is included with the packet payload; and transmit the write packet.

4. The I/O adapter device of claim 3, wherein the circuit further configured to:

calculate a header error correction value for the packet header; and add the header error correction value to the packet header.

5. The I/O adapter device of claim 3, wherein the circuit comprises a pipeline, wherein the pipeline includes:

a plurality of streaming components, wherein each streaming component is configured to perform one or more packet processing operations for the I/O adapter device; and a streaming interconnect coupled to the plurality of streaming components, wherein the streaming interconnect is configured for routing data between the plurality of streaming components.

6. The I/O adapter device of claim 3, wherein the circuit comprises a pipeline, wherein the pipeline comprises one or more of a host interface unit, a parsing and steering unit, a compression/decompression unit, an encryption/decryption unit, a splitter unit, an assembler unit, a network offloads unit, a media access control unit, a payload manager, or a payload buffer.

7. The I/O adapter device of claim 3, wherein the pre-determined data block size is less than a size of the write data.

8. The I/O adapter device of claim 3, wherein the pre-determined data block size is less than a size of the write data, wherein the write packet includes at least one error correction value from the one or more error correction values, and wherein the circuit is further configured to:

generate an additional write packet for the write request, wherein the additional write packet includes a second error correction value from the one or more error correction values; and transmit the additional write packet.

9. The I/O adapter device of claim 3, wherein the one or more error correction values comprises one error correction value, and wherein the circuit is further configured to:

generate one or more additional write packets for the write request, wherein the one or more additional write packets each include a respective portion of the write data, and wherein a last write packet from the one or more additional write packets includes the one error correction value.

10. The I/O adapter device of claim 3, wherein the pre-determined data block size is less than a size of the write data, and wherein the packet payload includes two or more error correction values from the one or more error correction values.

11. The I/O adapter device of claim 3, wherein the pre-determined data block size is greater than a size of the write data, and wherein the circuit is further configured to:
receive an additional write request from the virtual machine, where the at least one error correction value is further determined using additional data from the additional write request;
generate an additional write packet for the additional write request, wherein the additional write packet includes the at least one error correction value from the one or more error correction values; and
transmit the additional write packet.

12. The I/O adapter device of claim 3, wherein the circuit is further configured to:
retrieve a stored error correction value; and
use the stored error correction value to determine the at least one error correction value.

13. The I/O adapter device of claim 3, where the circuit is further configured to:
store the at least one error correction value.

14. An Input/Output (I/O) adapter device, comprising:
a first integrated circuit device including a circuit configured to:
receive a read request from a virtual machine executing on a host device coupled to the I/O adapter device;
generate a read packet for the read request;
transmit the read packet;
receive a response packet, wherein the response packet includes a packet header and a packet payload including read data requested by the read request, wherein the packet header includes a configuration for calculating one or more expected error correction values, wherein the configuration is based on the virtual machine that issued the read request or a queue on the I/O adapter device for receiving the read request, wherein the configuration specifies a pre-determined data block size, wherein the pre-determined data block size identifies an amount of data over which to calculate an expected error correction value, and wherein, when an error is introduced into the read data, the error is detectable using the expected error correction value; and
determine the one or more expected error correction values, wherein at least one expected error correction value from the one or more expected error correction values is determined using the read data, wherein a portion of the read data used to determine the at least one expected error correction value is less than or equal to the pre-determined data block size, and wherein the at least one expected error correction value is compared against a received error correction value when a last part of data over which the at least one expected error correction value was calculated is included in the read data and the received error correction value is included in the packet payload.

15. The I/O adapter device of claim 14, wherein the pre-determined data block size is less than a size of the read data, and wherein the packet payload includes two or more error correction values from the one or more error correction values.

16. The I/O adapter device of claim 14, wherein the pre-determined data block size is greater than a size of the read data, and wherein the circuit is further configured to:
receive an additional read request from the virtual machine;
generate an additional read packet for the additional read request;
transmit the additional read packet; and
receive an additional response packet, wherein the additional response packet includes additional read data requested by the additional read request, and wherein the at least one expected error correction value is further determined using the additional read data.

17. The I/O adapter device of claim 14, wherein the circuit is further configured to:
retrieve a stored error correction value; and
determine the at least one expected error correction value using the stored error correction value.

18. The I/O adapter device of claim 14, wherein the circuit is further configured to:
store the at least one expected error correction value.

19. The I/O adapter device of claim 14, further comprising:
a processor comprising one or more processing cores, wherein each processing core is configured to execute a respective plurality of computer-executable instructions, and wherein the plurality of computer-executable instructions, when executed by a respective processing core, cause the respective processing core to execute operations including:
determining the configuration for calculating the one or more expected error correction values, wherein the configuration is included in the read packet.

20. A computer-implemented method, comprising:
receiving, by an Input/Output (I/O) adapter device, a write request from a virtual machine executing on a host device coupled to the I/O adapter device, wherein the write request includes write data;
determining a configuration for calculating one or more error correction values, wherein the I/O adapter device includes a processor circuit to determine the configuration, wherein the configuration is determined based on the virtual machine that issued the write request or a queue on the I/O adapter device for receiving the write request, wherein the configuration specifies a pre-determined data block size, wherein the pre-determined data block size identifies an amount of data over which to calculate an error correction value, and wherein, when an error is introduced into the write data during transmission of the write data, the error is detectable using the error correction value;
determine the one or more error correction values, wherein the I/O adapter device includes a circuit configured to determine the one or more error correction values, wherein at least one error correction value from the one or more error correction values is determined using the write data, and wherein a portion of the write data used to determine the at least one error correction value is less than or equal in size to the pre-determined data block size;
generating a write packet for the write request, wherein the write packet is generated by the circuit, wherein the write packet includes a packet header and a packet payload, wherein the packet header includes the configuration for calculating the error correction value, and wherein the packet payload includes at least a portion of the write data;
determining whether to include the one or more error correction values in the write packet, wherein an error correction value from the one or more error correction values is included in the write packet when a last part of data over which the error correction value was calculated is included with the packet payload; and
transmitting the write packet.

21. The computer-implemented method of claim 20, further comprising:
  calculating a header error correction value for the packet header; and
  adding the header error correction value to the packet header.

22. The method of claim 20, wherein the pre-determined data block size is less than, equal to, or great than a size of the write data.

* * * * *